(12) United States Patent
Shin et al.

(10) Patent No.: US 12,727,363 B2
(45) Date of Patent: Sep. 1, 2026

(54) DISPLAY DEVICE INCLUDING AUXILIARY ELECTRODE

(71) Applicant: Samsung Display Co., Ltd., Yongin-Si (KR)

(72) Inventors: Hyuneok Shin, Yongin-si (KR); Joonyong Park, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 451 days.

(21) Appl. No.: 18/198,321

(22) Filed: May 17, 2023

(65) Prior Publication Data

US 2024/0107856 A1 Mar. 28, 2024

(30) Foreign Application Priority Data

Sep. 28, 2022 (KR) ........................ 10-2022-0123562

(51) Int. Cl.
*H10K 59/80* (2023.01)
*H10K 59/12* (2023.01)
(Continued)

(52) U.S. Cl.
CPC ... *H10K 59/80517* (2023.02); *H10K 59/1201* (2023.02); *H10K 59/122* (2023.02);
(Continued)

(58) Field of Classification Search
CPC ............. H01L 51/5271; H01L 27/3246; H01L 51/5228; H01L 51/56; H01L 27/322; H10K 59/80517; H10K 59/1201; H10K 59/122; H10K 71/166; H10K 71/231; H10K 2102/102; H10K 2102/103;
(Continued)

(56) References Cited

U.S. PATENT DOCUMENTS 7,754,185 B2 7/2010 McHugh et al.
7,903,210 B2 * 3/2011 Sugiura ............ G02F 1/133553 349/114

(Continued)

FOREIGN PATENT DOCUMENTS

CN 113078277 A 7/2021
KR 10-2015-0030440 A 3/2015

(Continued)

*Primary Examiner* — Caleb E Henry
(74) *Attorney, Agent, or Firm* — Innovation Counsel LLP

(57) ABSTRACT

Disclosed is a display device including a base substrate, a circuit layer disposed on the base substrate, a first electrode disposed on the circuit layer, an auxiliary electrode disposed on the circuit layer and spaced apart from the first electrode, a pixel defining layer disposed on the circuit layer and the first electrode, and having an opening which exposes the first electrode, a light-emitting layer disposed in the opening, and a second electrode disposed on the light-emitting layer, wherein the auxiliary electrode includes a first layer including the same material as a material of the first electrode, a second layer disposed on the first layer and including silver (Ag) or silver alloy (Ag alloy), and a third layer disposed on the second layer and including molybdenum (Mo) or molybdenum alloy (Mo alloy), and wherein the second electrode may be in contact with a side face of the second layer.

14 Claims, 12 Drawing Sheets

(51) Int. Cl.
*H10K 59/122* (2023.01)
*H10K 71/16* (2023.01)
*H10K 71/20* (2023.01)
*H10K 102/10* (2023.01)

(52) U.S. Cl.
CPC ......... *H10K 71/166* (2023.02); *H10K 71/231* (2023.02); *H10K 2102/102* (2023.02); *H10K 2102/103* (2023.02)

(58) Field of Classification Search
CPC ........... H10K 59/80524; H10K 71/621; H10K 59/1315; H10K 50/814; H10K 50/822; H10K 71/00; H10K 71/10; H10K 2102/351; H10K 59/873; H10K 71/16; H10K 59/352; H10K 59/80516; H10K 59/80521
See application file for complete search history.

(56) References Cited

U.S. PATENT DOCUMENTS 9,082,668 B2* 7/2015 Kim .................. H10K 59/8791
10,090,370 B2* 10/2018 Lee ..................... H10K 59/122
10,205,117 B2* 2/2019 Song ................... H10K 59/122
10,290,832 B2* 5/2019 Ueda ................... H10K 59/122
10,497,903 B2* 12/2019 Ueda ............... H10K 59/80522
10,727,292 B2* 7/2020 Kim ...................... H10K 59/35
10,826,023 B2* 11/2020 Ueda ................... H10K 59/122
10,861,926 B2* 12/2020 Gai ..................... H10K 59/131
11,201,311 B2* 12/2021 Lee ....................... H10K 71/70
11,563,198 B2* 1/2023 Ueda ............... H10K 59/80522
11,844,255 B2* 12/2023 Wu ..................... H10K 59/131
2009/0009069 A1* 1/2009 Takata ................ H10K 59/122 445/24
2012/0074397 A1* 3/2012 Okumoto ............ H10K 59/122 438/34
2013/0056719 A1* 3/2013 Komatsu ............... H10K 50/17 438/34
2013/0285042 A1* 10/2013 Komatsu ........... H10K 59/1315 438/34
2013/0328024 A1* 12/2013 Mizusaki .............. H05B 33/10 438/46
2013/0328039 A1* 12/2013 Ohuchi ........... H10K 59/80516 257/40
2014/0151651 A1* 6/2014 Jin ...................... H10K 59/122 438/23
2014/0183483 A1* 7/2014 Kim .................... H10K 59/131 438/46
2014/0197391 A1* 7/2014 Hatakeyama .... H10K 59/80515 438/34
2014/0239262 A1* 8/2014 Kim .................... H10K 59/123 257/40
2015/0097168 A1* 4/2015 Hanawa .............. H10K 59/121 257/40
2015/0144906 A1* 5/2015 Ichikawa ............ H10K 50/165 438/34
2016/0126304 A1* 5/2016 Cho .................... H10K 59/131 438/23
2016/0155790 A1* 6/2016 Lee ..................... H10K 59/122 438/34
2016/0240810 A1* 8/2016 Oh ....................... H10K 59/121
2016/0293878 A1* 10/2016 Maruyama ....... H10K 59/80522
2017/0110530 A1* 4/2017 Lee ...................... H10K 50/824
2017/0288174 A1* 10/2017 Ueda .................... H10K 50/856
2017/0373130 A1* 12/2017 Lee ...................... H10K 59/131
2018/0006098 A1* 1/2018 Hong ................. H10K 59/1201
2019/0115561 A1* 4/2019 Tang .................... H10D 86/441
2019/0129269 A1* 5/2019 Ogawa ............. G02F 1/133553
2019/0229293 A1* 7/2019 Ueda .................... H10K 59/122
2019/0348491 A1* 11/2019 Chung ............... H10K 59/1213
2020/0083483 A1* 3/2020 Ueda ............... H10K 59/80522
2020/0185638 A1* 6/2020 Choi ...................... H10K 59/38
2021/0013451 A1* 1/2021 Ueda ............... H10K 59/80522
2022/0093893 A1 3/2022 Zhang et al.
2022/0093894 A1 3/2022 Song et al.
2022/0140293 A1* 5/2022 Xia .................... H10K 59/8792 257/89
2022/0209194 A1* 6/2022 Kim ..................... H10K 59/122
2022/0320472 A1* 10/2022 Tabatake ............. H10K 59/131
2023/0028784 A1* 1/2023 Jung ................. H10K 59/1315
2023/0044202 A1* 2/2023 Kim ..................... H10K 59/122
2023/0077299 A1* 3/2023 Lee .................... H10K 59/1315
2023/0078082 A1* 3/2023 Kim ..................... H10K 59/131 257/40
2023/0083513 A1* 3/2023 Ueda .................... H10K 59/878 257/40
2023/0084087 A1* 3/2023 Choi ...................... H10K 50/15 257/40
2023/0110744 A1* 4/2023 Kim ..................... H10K 50/824 257/107
2023/0111888 A1* 4/2023 Choi ...................... H10K 85/60 257/13
2023/0209861 A1* 6/2023 Lee ...................... H10K 50/171 257/91

FOREIGN PATENT DOCUMENTS

KR 10-2017-0112540 A 10/2017
KR 10-2263261 B1 6/2021

* cited by examiner

DP
DA
NDA
PXnm
DLm
SL1
SLn
PD
PX11
DL1
GDC
DR1
DR2
DR3

DP
TFE
DP-OL
DP-CL
SE
L3
L2
L1
L13
L12
L11
50
40
3S
20
10
BS
TFL
NPXA
PXA1
NPXA
PDL
CE
CH3
EL
PDL
S1
AT
D1
G1
T1
PDL-OP1
CE
OU
OLED
AE
A3
A2
A1
CH2
CNE
CH1
DR3
DRa
DRb

DISPLAY DEVICE INCLUDING AUXILIARY ELECTRODE

CROSS-REFERENCE TO RELATED APPLICATIONS

This application claims priority under 35 U.S.C. § 119 to Korean Patent Application No. 10-2022-0123562 filed on Sep. 28, 2022, in the Korean Intellectual Property Office, the disclosures of which are incorporated by reference herein in their entireties.

BACKGROUND

Embodiments of the present disclosure described herein relate to a display device with improved reliability and a method for manufacturing the display device.

Each of multimedia electronic devices such as a television, a mobile phone, a tablet computer, a navigation system, a game console, etc. may include a display device for displaying an image. The display device may include a display panel including a plurality of pixels for displaying an image, and each of the pixels may include a light-emitting element generating light and a driving element connected to the light-emitting element.

A display device having an organic light-emitting element among the light-emitting elements has advantages such as a wide viewing angle, fast response speed, and low power consumption, and thus is attracting attention as a next-generation display device. However, as the display device becomes larger, there is a problem that luminance is not uniform.

SUMMARY

Embodiments of the present disclosure provide a display device having uniform luminance and improved reliability, and a method for manufacturing the display device.

According to an embodiment, a display device includes a base substrate, a circuit layer disposed on the base substrate, a first electrode disposed on the circuit layer, an auxiliary electrode disposed on the circuit layer and spaced apart from the first electrode, a pixel defining layer disposed on the circuit layer and the first electrode, and having an opening which exposes the first electrode, a light-emitting layer disposed in the opening, and a second electrode disposed on the light-emitting layer, wherein the auxiliary electrode includes a first layer including the same material as a material of the first electrode, a second layer disposed on the first layer and including silver (Ag) or silver alloy (Ag alloy), and a third layer disposed on the second layer and including molybdenum (Mo) or molybdenum alloy (Mo alloy), and wherein the second electrode may be in contact with a side surface of the second layer.

The first electrode may include a layer made of indium tin oxide (ITO), a layer made of silver (Ag), and a layer made of indium tin oxide (ITO) stacked sequentially.

The first layer may include a layer made of indium tin oxide (ITO), a layer made of silver (Ag), and a layer made of indium tin oxide (ITO) stacked sequentially.

The second electrode may be in contact with a top surface of the first layer

The auxiliary electrode may not overlap the opening in a plan view.

The pixel defining layer may be further disposed on the third layer.

A thickness of the second layer may be greater than a thickness of the first layer.

The first electrode and the auxiliary electrode may be disposed in the same layer.

The silver alloy may include AgIn alloy.

The molybdenum alloy may include MoNb alloy.

A width in a first direction of the second layer may be smaller than a width in the first direction of the third layer.

The second electrode and the auxiliary electrode may be electrically connected to each other.

The second electrode may include the same material as one of materials included in the second layer.

The second electrode may include AgMg alloy.

According to an embodiment, a method for manufacturing a display device includes providing a target substrate including a base substrate and a circuit layer disposed on the base substrate, forming a plurality of metal layers on the circuit layer, patterning the plurality of metal layers to form a first electrode disposed in a light-emitting area and an auxiliary electrode disposed in a non-light-emitting area, forming a pixel defining layer the first electrode, the pixel defining layer including an opening which exposes the first electrode, forming a light-emitting layer in the opening, and forming a second electrode on the light-emitting layer, wherein the auxiliary electrode includes a first layer disposed on the circuit layer, the first layer may including the same material as a material of the first electrode, a second layer disposed on the first layer, the second layer may including silver (Ag) or silver alloy (Ag alloy), and a third layer disposed on the second layer, the third layer may including molybdenum (Mo) or molybdenum alloy (Mo alloy).

The patterning of the plurality of metal layers to form the first electrode and the auxiliary electrode is performed using one mask.

The patterning of the plurality of metal layers to form the first electrode and the auxiliary electrode is performed using a first etchant which includes a mixture of phosphoric acid, nitric acid and acetic acid ($H_3PO_4$+$HNO_3$+$CH_3COOH$).

The first layer, the second layer, the third layer may be formed using one mask.

The second electrode may contact a side face of the second layer.

The forming of the plurality of metal layers may include forming a pre-first layer, the pre-first layer may including a layer made of indium tin oxide (ITO), a layer made of silver (Ag), and a layer made of indium tin oxide (ITO) stacked sequentially, forming a pre-second layer including silver (Ag), and forming a pre-third layer including molybdenum (Mo).

BRIEF DESCRIPTION OF THE DRAWINGS

The above and other objects and features of the present disclosure will become apparent by describing in detail embodiments thereof with reference to the accompanying drawings.

DETAILED DESCRIPTION

Figure 1:
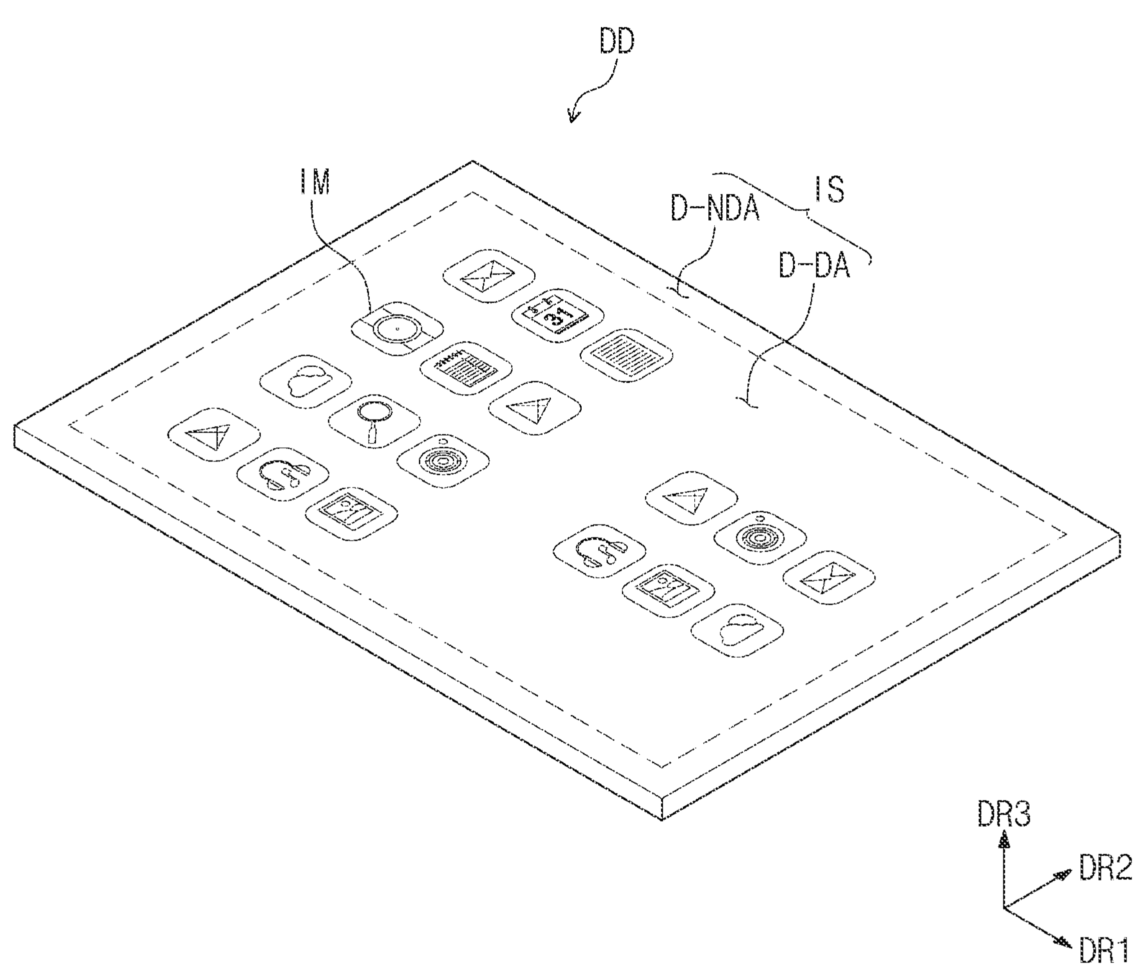
FIG. 1 is a perspective view of a display device according to an embodiment of the present disclosure.

As used herein, when a component (or a region, a layer, a portion, and the like) is referred to as being "on", "connected to", or "coupled to" another component, it means that the component may be directly disposed/connected/coupled on another component or a third component may be disposed between the component and another component.

Like reference numerals refer to like components. In addition, in the drawings, thicknesses, ratios, and dimensions of components are exaggerated for effective description of technical content. "and/or" includes all of one or more combinations that the associated components may define.

Terms such as first, second, and the like may be used to describe various components, but the components should not be limited by the terms. The above terms are used only for the purpose of distinguishing one component from another. For example, without departing from the scope of the present disclosure, a first component may be named as a second component, and similarly, the second component may also be named as the first component. The singular expression includes the plural expression unless the context clearly dictates otherwise.

In addition, terms such as "beneath", "below", "on", "above" are used to describe the relationship of the components illustrated in the drawings. The above terms are relative concepts, and are described with reference to directions indicated in the drawings.

It should be understood that terms such as "include" or "have" are intended to specify that a feature, a number, a step, an operation, a component, a part, or a combination thereof described in the specification is present, and do not preclude a possibility of addition or existence of one or more other features or numbers, steps, operations, components, parts, or combinations thereof.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments of the present disclosure will be described with reference to the drawings.

Figure 2:
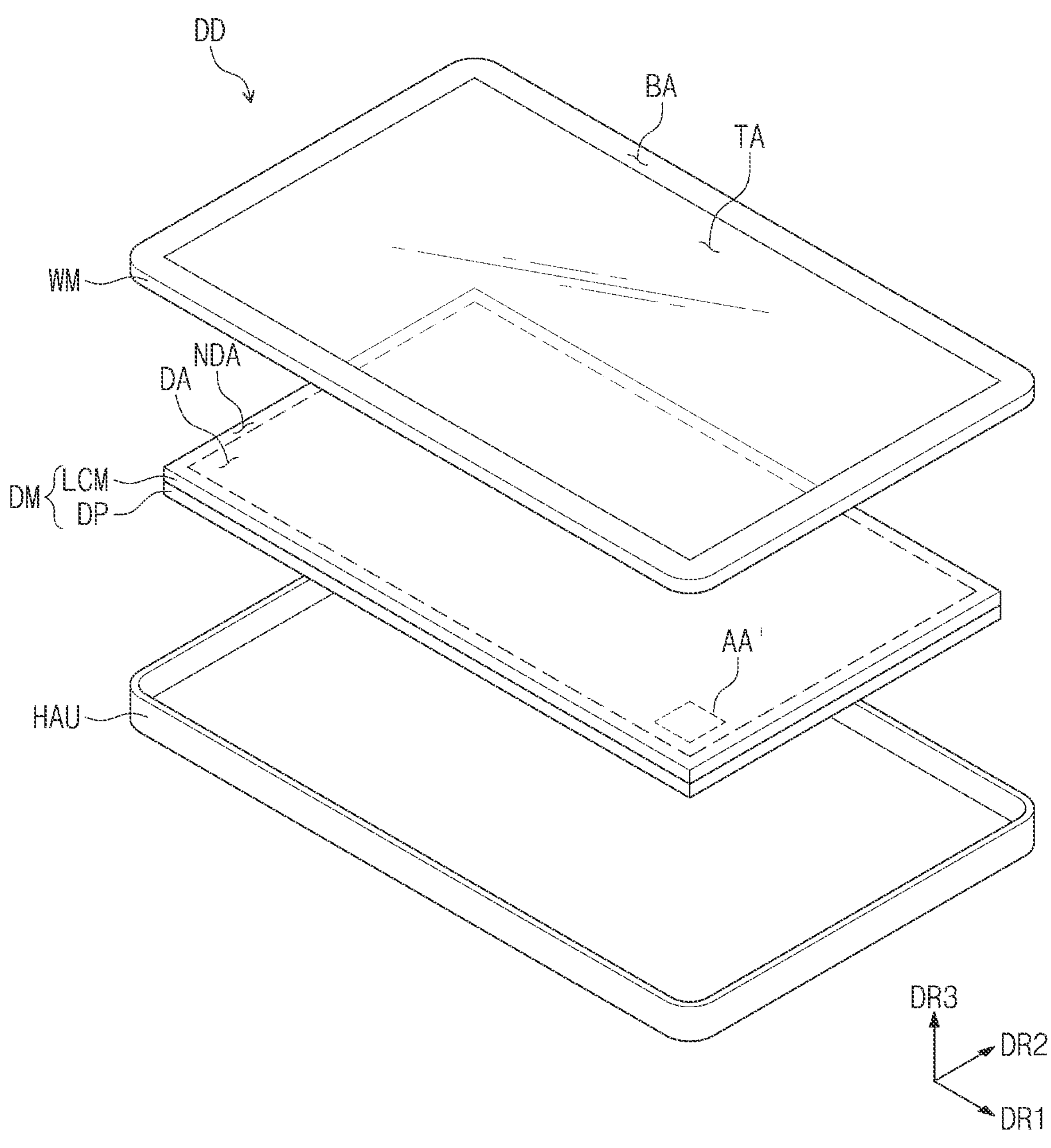
FIG. 2 is an exploded perspective view of a display device according to an embodiment of the present disclosure.

FIG. 1 is a perspective view of a display device according to an embodiment of the present disclosure. FIG. 2 is an exploded perspective view of a display device according to an embodiment of the present disclosure.

Referring to FIG. 1 and FIG. 2, a display device DD may be a device that is activated according to an electrical signal to display an image. The display device DD may be included in embodiments of various electronic devices. For example, the display device DD may be included in large devices such as televisions and external billboards, and small and medium-sized devices such as monitors, mobile phones, tablet computers, navigation devices, and game consoles. In one example, embodiments of the display device DD are examples and are not limited to any one unless departing from the concept of the present disclosure.

The display device DD may have a rectangular shape having long sides extending in a first direction DR1 and short sides extending in a second direction DR2 intersecting the first direction DR1. However, the present disclosure is not limited thereto, and the display device DD may have various shapes such as a circle and a polygon.

The display device DD may display an image IM in a third direction DR3 through a display surface IS defined by the first direction DR1 and the second direction DR2. The third direction DR3 may be parallel to a normal direction to the display surface IS. The display surface IS through which the image IM is displayed may correspond to a front surface of the display device DD. The image IM may include a still image as well as a moving image. FIG. 1 shows icon images as an example of the image IM.

As used herein, "a plan view" may be a view in the third direction DR3. As used herein, "a cross-sectional view" may be a view in the first direction DR1 or the second direction DR2. A direction indicated by each of the first to third directions DR1, DR2, and DR3 is a relative concept and may be directions other than the directions defined hereabove.

FIG. 1 shows an example of the display device DD having the flat display surface IS. However, a shape of the display surface IS of the display device DD is not limited thereto, and may be a curved shape or a three-dimensional shape.

The display device DD may be a flexible device. The terms "flexible" refers to a property that the device may be bent. The flexible device may include any structure in which the device is entirely foldable or bendable by several nanometers. For example, the flexible display device DD may include a curved display device or a foldable display device. However, the present disclosure is not limited thereto, and the display device DD may be a rigid device.

The display surface IS of the display device DD may include a display area D-DA and a non-display area D-NDA. In the display area D-DA, the image IM may be displayed. A user may recognize the image IM through the display area D-DA. In the present embodiment, the display area D-DA is illustrated to have a rectangular shape. However, this is illustrated by way of example, and the display area D-DA may have various shapes.

The non-display area D-NDA may not display the image IM. The non-display area D-NDA may correspond to a portion having a predetermined color and blocking light. The non-display area D-NDA may be disposed adjacent to the display area D-DA. For example, the non-display area D-NDA may be disposed outside the display area D-DA so as to surround the display area D-DA. However, this is illustrated by way of example, and the non-display area D-NDA may be disposed adjacent to only one side of the display area D-DA or may be disposed on a side face other than a front side of the display device DD. However, the present disclosure is not limited thereto, and the non-display area D-NDA may be omitted.

In one example, the display device DD of an embodiment may detect an external input applied from an outside. The external input may have various forms such as pressure, temperature, and light provided from the outside. The external input may include an input applied in proximity to the display device DD (for example, hovering), as well as an input in contact with the display device DD (for example, a user's hand or a pen).

The display device DD may include a window WM, a display module DM, and an outer housing HAU. The display module DM may include a display panel DP and a light control member LCM.

The window WM may be disposed on the display module DM. The window WM may protect the display module DM from external impact. A front face of the window WM may correspond to the display surface IS of the display device DD as described above. The front face of the window WM may include a transmissive area TA and a bezel area BA.

The transmissive area TA of the window WM may be an optically transparent area. The window WM may transmit the image provided from the display module DM through the transmissive area TA, such that the user may view the image. The transmissive area TA may an area that corresponds to the display area D-DA of the display device DD.

The window WM may include an optically transparent insulating material. For example, the window WM may include glass, sapphire, or plastic. The window WM may have a single-layer or multi-layer structure. The window WM may further include functional layers such as an anti-fingerprint layer, a phase control layer and a hard coating layer disposed on an optically transparent substrate.

The bezel area BA of the window WM may be provided as an area in which a material including a predetermined color is deposited, coated or printed. The bezel area BA of the window WM may prevent one component of the display module DM disposed to overlap the bezel area BA from being visually recognized from the outside. The bezel area BA may be an area that corresponds to the non-display area D-NDA of the display device DD.

The display module DM may be disposed between the window WM and the outer housing HAU. The display module DM may display an image in response to an electrical signal. The display module DM may include a display area DA and a non-display area NDA disposed adjacent to the display area DA.

The display area DA may be an area activated according to an electrical signal. The display area DA may be an area for emitting an image provided by the display module DM. The display area DA of the display module DM may correspond to the above-described transmissive area TA. As used herein, the phrase "area/portion and area/portion corresponds to each other" means "areas/portions overlap each other" in a plan view and is not limited to the meaning that the areas/portions have the same area and/or the same shape. The image displayed in the display area DA may be viewed from the outside through the transmissive area TA.

The non-display area NDA may be disposed adjacent to the display area DA. For example, the non-display area NDA may enclose the display area DA. However, the present disclosure is not limited thereto, and the non-display area NDA may have various shapes. The non-display area NDA may be an area in which a driving circuit or a driving wiring for driving the display area DA, various signal lines providing electrical signals, and pads are disposed. The non-display area NDA of the display module DM may correspond to the bezel area BA as described above. The bezel area BA may prevent components of the display module DM disposed in the non-display area NDA from being visually recognized.

The display panel DP according to an embodiment may be a light-emitting display panel, and is not particularly limited. For example, the display panel DP may be an organic light-emitting display panel, an inorganic light-emitting display panel, or a quantum dot light-emitting display panel. A light-emitting layer of the organic light-emitting display panel may include an organic light-emitting material. A light-emitting layer of the inorganic light-emitting display panel may include an inorganic light-emitting material. For example, the light-emitting layer of the inorganic light-emitting display panel may include micro LED or nano LED. A light-emitting layer of the quantum dot light-emitting display panel may include quantum dots or quantum rods. Hereinafter, an example in which the display panel DP is embodied as the organic light-emitting display panel is described.

The light control member LCM may be disposed on the display panel DP. The light control member LCM may be combined with the display panel DP via a bonding process using a sealing member. However, the present disclosure is not limited thereto, and the light control member LCM may be disposed directly on the display panel DP. As used herein, a phrase "a member is formed thereon by consecutive processes without using a separate adhesive layer or adhesive member" may be expressed as "the member is directly disposed thereon". For example, the expression "the light control member LCM is disposed directly on the display panel DP" may mean that after the display panel DP is formed, a component of the light control member LCM is directly formed on a base face of the display panel DP via consecutive processes.

The light control member LCM may include light control patterns that may change optical properties of source light provided from the display panel DP. The light control member LCM may selectively convert a wavelength or color of the source light, or transmit the source light therethrough. The light control member LCM may control a color purity or color gamut of light emitted from the display device DD, and may prevent reflection of external light incident from the outside of the display device DD.

The outer housing HAU may be disposed under the display module DM to accommodate the display module DM therein. The outer housing HAU may absorb impact from the outside and may prevent foreign material/moisture from penetrating into the display module DM to protect the display module DM. The outer housing HAU of an embodiment may have a structure in which a plurality of receiving members are combined with each other.

In one example, the display module DM may further include an input sensing unit. The input sensing unit may acquire coordinate information of an external input applied from the outside of the display device DD. The input sensing unit may be disposed between the display panel DP and the light control member LCM. For example, the input sensing unit may be directly disposed on the display panel DP via consecutive processes. However, the present disclosure is not limited thereto, and the input sensing unit may be separately manufactured and then attached to the display panel DP using an adhesive layer.

The display device DD may further include an electronic module including various functional modules for operating the display module DM, a power supply module for supplying power required for the display device DD, and a bracket, etc. which is coupled to the display module DM and/or the outer housing HAU so as to divide an inner space of the display device DD into various sub-spaces.

Figure 3:
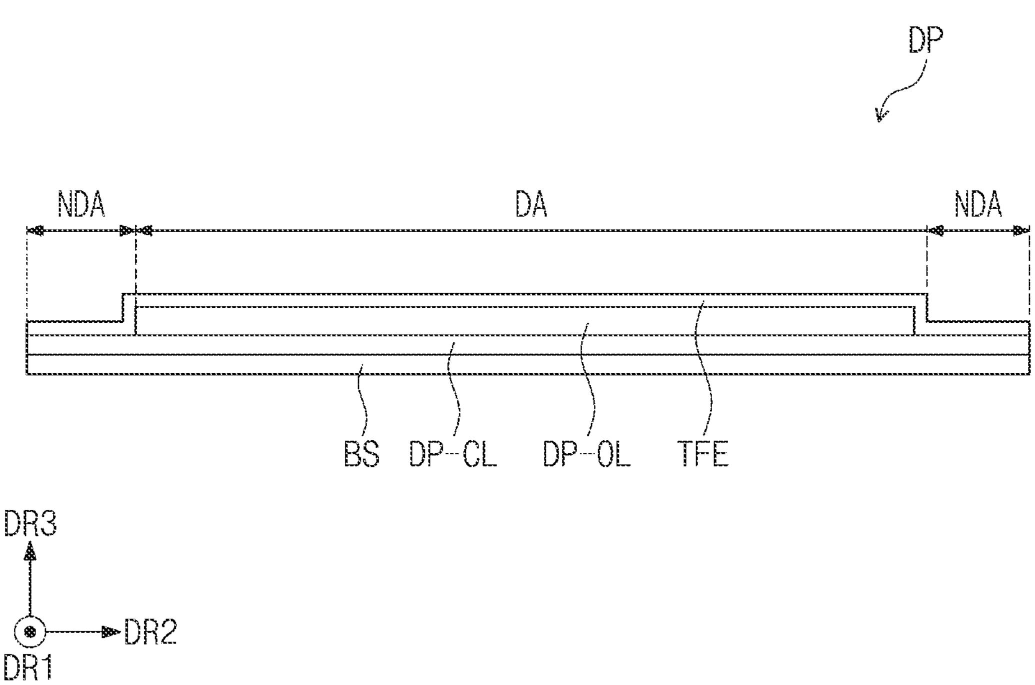
FIG. 3 is a cross-sectional view of a display panel according to an embodiment of the present disclosure.

FIG. 3 is a cross-sectional view of a display panel according to an embodiment of the present disclosure.

Referring to FIG. 3, the display panel DP may include a base substrate BS, a circuit layer DP-CL, a display element layer DP-OL, and an encapsulation layer TFE.

The base substrate BS may include the display area DA and the non-display area NDA. The base substrate BS may provide a base surface on which the circuit layer DP-CL is disposed. The base substrate BS may be a rigid substrate. However, the present disclosure is not limited thereto and the base substrate BS may be a flexible substrate.

The circuit layer DP-CL may be disposed on the base substrate BS. The circuit layer DP-CL may include driving elements, signal lines and signal pads. The display element layer DP-OL may include light-emitting elements overlapping the display area DA. The light-emitting elements of the display element layer DP-OL may be electrically connected to the driving elements of the circuit layer DP-CL, and may provide the source light through the display area DA in response to a signal of the driving element.

The encapsulation layer TFE may be disposed on the display element layer DP-OL so as to seal the light-emitting elements. The encapsulation layer TFE may include a plurality of thin films. The thin films of the encapsulation layer TFE may be disposed to improve optical efficiency or to protect the light-emitting elements.

Figure 4:
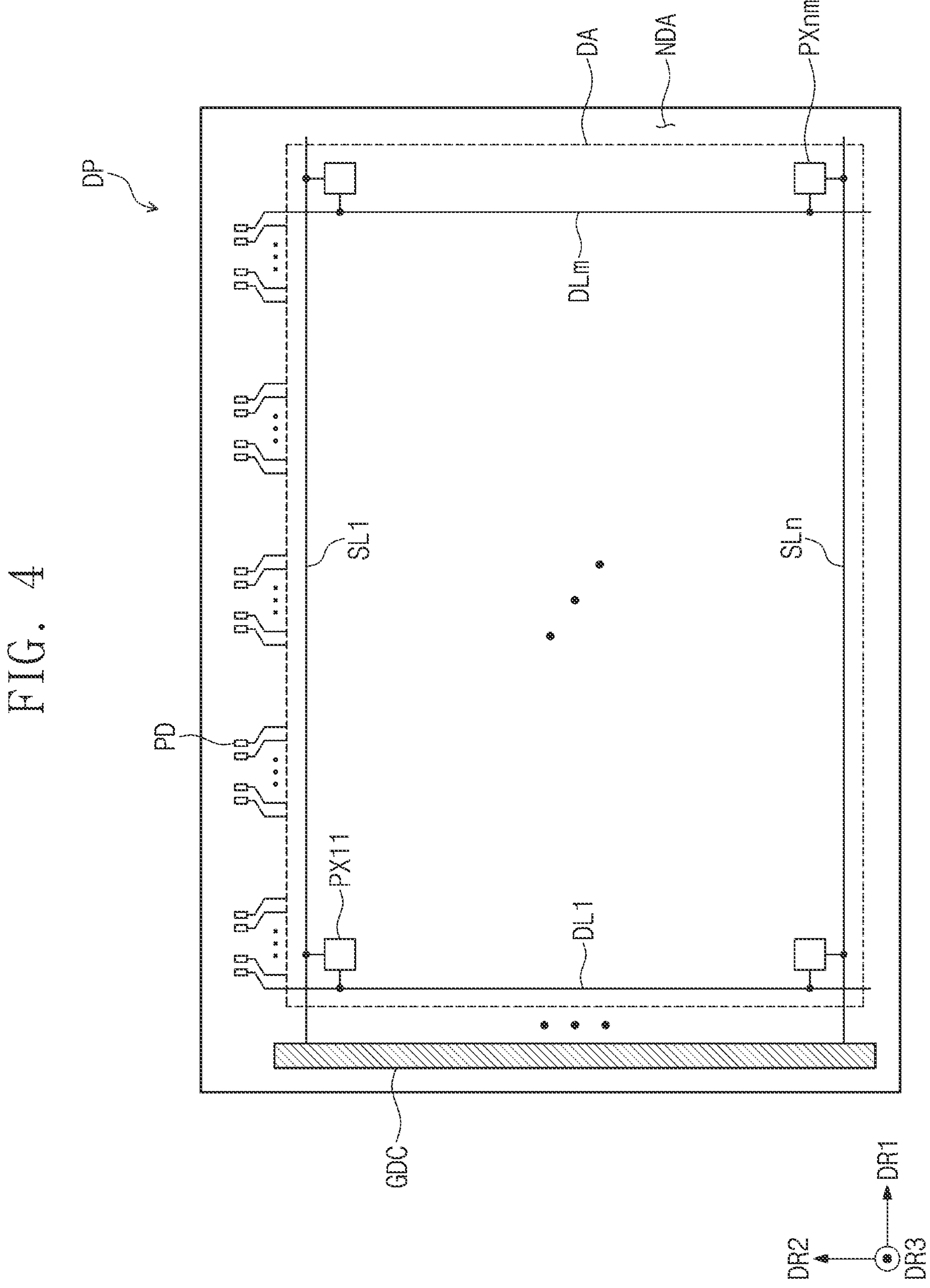
FIG. 4 is a plan view of a display panel according to an embodiment of the present disclosure.

FIG. 4 is a plan view of a display panel according to an embodiment of the present disclosure.

Referring to FIG. 4, the display panel DP may include pixels PX11 to PXnm arranged in the display area DA and signal lines SL1 to SLn and DL1 to DLm electrically connected to the pixels PX11 to PXnm. The display panel DP may include a driving circuit GDC and pads PD disposed in the non-display area NDA.

Each of the pixels PX11 to PXnm may include a pixel circuit including a plurality of transistors (for example, a switching transistor, a driving transistor, etc.) connected to the light-emitting element, and a capacitor. Each of the pixels PX11 to PXnm may emit light in response to an applied electrical signal. Although FIG. 4 illustrates an example in which the pixels PX11 to PXnm are arranged in a matrix form, an arrangement form of the pixels PX11 to PXnm is not limited thereto.

The signal lines SL1 to SLn, and DL1 to DLm may include the scan lines SL1 to SLn and the data lines DL1 to DLm. Each of the pixels PX11 to PXnm may be connected to a corresponding scan line among the scan lines SL1 to SLn and a corresponding data line among the data lines DL1 to DLm. Depending on a configuration of a pixel driving circuit of the pixels PX11 to PXnm, further types of signal lines may be provided in the display panel DP.

The driving circuit GDC may include a gate driving circuit. The gate driving circuit may generate gate signals and sequentially output the gate signals to the scan lines SL1 to SLn. The gate driving circuit may further output another control signal to the pixel driving circuit of the pixels PX11 to PXnm.

The driving circuit GDC and the pixels PX11 to PXnm according to an embodiment may include a plurality of thin film transistors formed using a LTPS (Low Temperature Polycrystalline Silicon) process or a LTPO (Low Temperature Polycrystalline Oxide) process.

The pads PD may be arranged along one direction on the non-display area NDA. The pads PD may be connected to a circuit board. Each of the pads PD may be connected to a corresponding signal line among the signal lines SL1 to SLn and DL1 to DLm and may be connected to a corresponding pixel through the corresponding signal line. The pads PD may be formed with the signal lines SL1 to SLn and DL1 to DLm. However, the present disclosure is not limited thereto, and the pads PD may be disposed in a layer different from a layer in which the signal lines SL1 to SLn and DL1 to DLm are disposed and may be connected thereto via contact holes.

Figure 5:
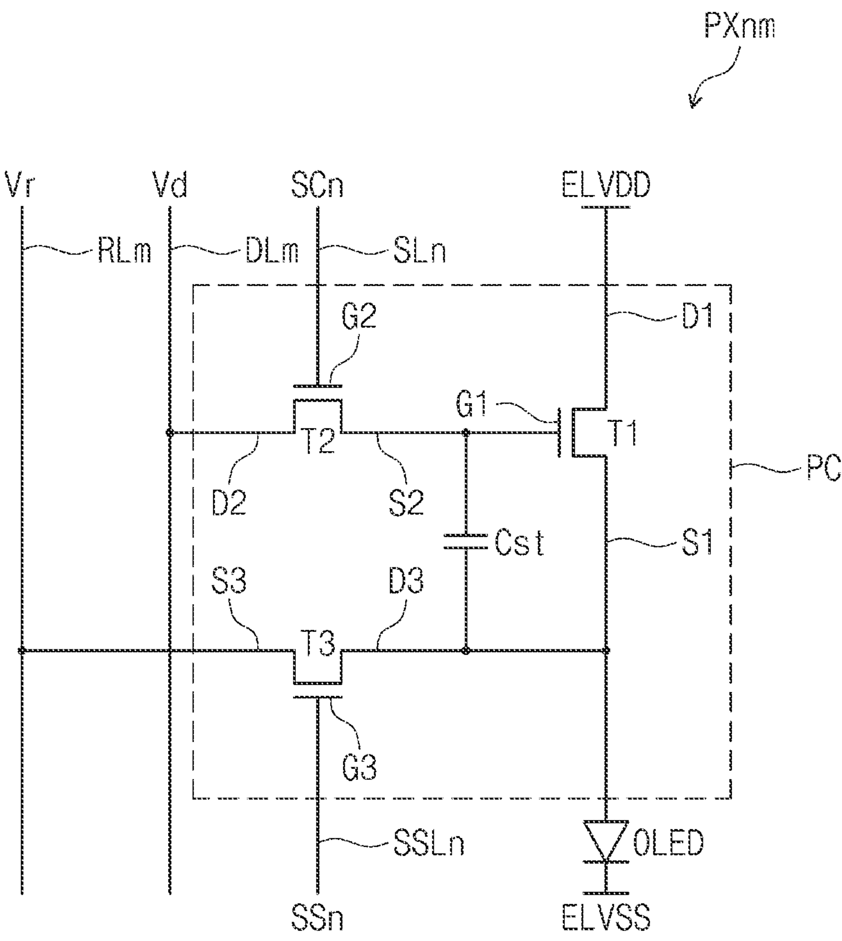
FIG. 5 is an equivalent circuit diagram of a pixel according to an embodiment of the present disclosure.

FIG. 5 is an equivalent circuit diagram of a pixel according to an embodiment of the present disclosure.

FIG. 5 shows the pixel PXnm connected to the n-th scan line SLn, a n-th sensing line SSLn, the m-th data line DLm, and a m-th reference line RLm by way of example.

Referring to FIG. 5, the pixel PXnm may include a pixel circuit PC and a light-emitting element OLED connected to the pixel circuit PC.

The pixel circuit PC may include a plurality of transistors T1, T2, and T3 and a capacitor Cst. The plurality of transistors T1, T2, and T3 may include the first transistor T1 (or a driving transistor), the second transistor T2 (or a switch transistor), and the third transistor T3 (or a sensing transistor). Each of the first to third transistors T1, T2, and T3 may be a thin film transistor.

Each of the first to third transistors T1, T2, and T3 may be a NMOS transistor. However, the present disclosure is not limited thereto, and at least one of the first to third transistors T1, T2, and T3 may be a PMOS transistor. Each of the first to third transistors T1, T2, and T3 may include each of sources S1, S2, and S3, each of drains D1, D2, and D3 and each of gates G1, G2, and G3.

The light-emitting element OLED may be an organic light-emitting element including an anode (or a first electrode) and a cathode (or a second electrode). The anode of the light-emitting element OLED may receive a first voltage ELVDD through the driving transistor T1, and the cathode of the light-emitting element OLED may receive a second voltage ELVSS. The light-emitting element OLED may emit light upon receiving the first voltage ELVDD and the second voltage ELVSS.

The driving transistor T1 may include the drain D1 that receives the first voltage ELVDD, the source S1 connected to the anode of the light-emitting element OLED, and the gate G1 connected to the capacitor Cst. The driving transistor T1 may control a driving current flowing through the light-emitting element OLED according to a voltage value stored in the capacitor Cst.

The switch transistor T2 may include the drain D2 connected to the m-th data line DLm, the source S2 connected to the capacitor Cst, and the gate G2 that receives an n-th write scan signal SCn. The m-th data line DLm may receive a data voltage Vd and a sensing voltage. The switch transistor T2 may transmit the data voltage Vd input from the m-th data line DLm to the driving transistor T1 according to a switching voltage input from the n-th write scan signal SCn.

The sensing transistor T3 may include the source S3 connected to the m-th reference line RLm, the drain D3 connected to the anode of the light-emitting element OLED, and the gate G3 that receives an n-th sampling scan signal SSn. The m-th reference line RLm may receive a reference voltage Vr.

The capacitor Cst may be connected between the gate G1 of the driving transistor T1 and the anode of the light-emitting element OLED. The capacitor Cst may include a first capacitor electrode connected to the gate G1 of the driving transistor T1 and a second capacitor electrode connected to the anode of the light-emitting element OLED. The capacitor Cst may store therein a voltage corresponding to a difference between a voltage transmitted from the switch transistor T2 and the first voltage ELVDD.

In one example, an equivalent circuit of the pixel PXnm is not limited to the equivalent circuit as illustrated in FIG. 5. In another embodiment of the present disclosure, the equivalent circuit diagram of the pixel PXnm may be implemented in various forms in order to achieve emission from the light-emitting element OLED.

Figure 6:
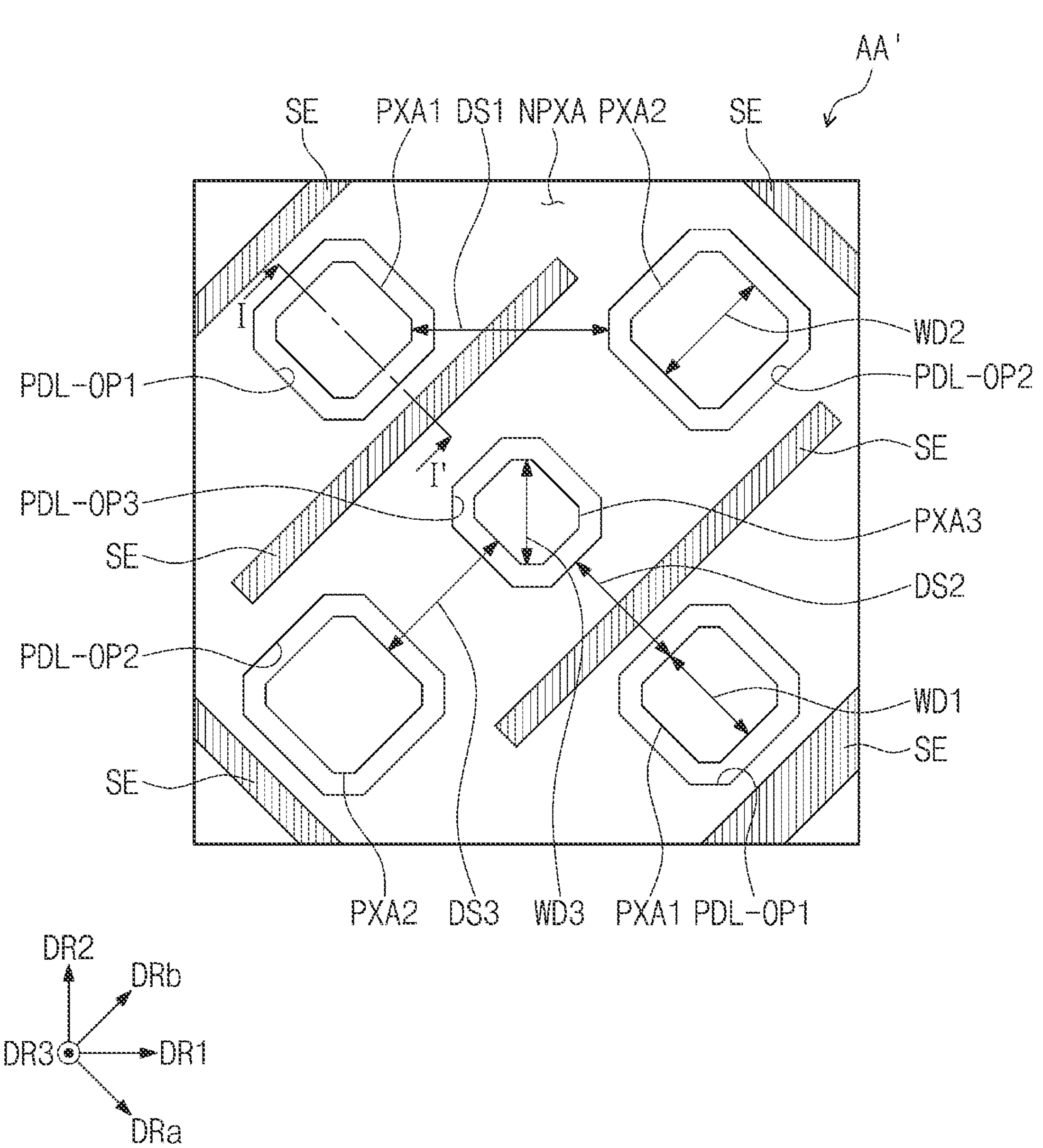
FIG. 6 is an enlarged plan view showing an AA' area of FIG. 2 according to an embodiment of the present disclosure.

FIG. 6 is an enlarged plan view showing an AA' area of FIG. 2 according to an embodiment of the present disclosure.

Referring to FIG. 6, in the display panel DP, light-emitting areas PXA1, PXA2, and PXA3 in which the light-emitting elements are arranged, and a non-light-emitting area NPXA disposed adjacent to the light-emitting areas PXA1, PXA2, and PXA3 may be defined.

The light-emitting areas PXA1, PXA2, and PXA3 may correspond to areas from which light provided from the light-emitting element is emitted. The light-emitting areas PXA1, PXA2, and PXA3 may include the first light-emitting area PXA1, the second light-emitting area PXA2 and the third light-emitting area PXA3.

The first to third light-emitting areas PXA1, PXA2, and PXA3 may be distinguished from each other based on a color of light emitted toward the outside of the display device DD.

The first light-emitting area PXA1 may correspond to an area providing first color light, the second light-emitting area PXA2 may correspond to an area providing second color light, and the third light-emitting area PXA3 may correspond to an area that provides third color light. In an embodiment, the first to third color lights may be different colors. For example, the first color light may be red light, the second color light may be blue light, and the third color light may be green light. However, an embodiment is not necessarily limited thereto.

Figure 7A:
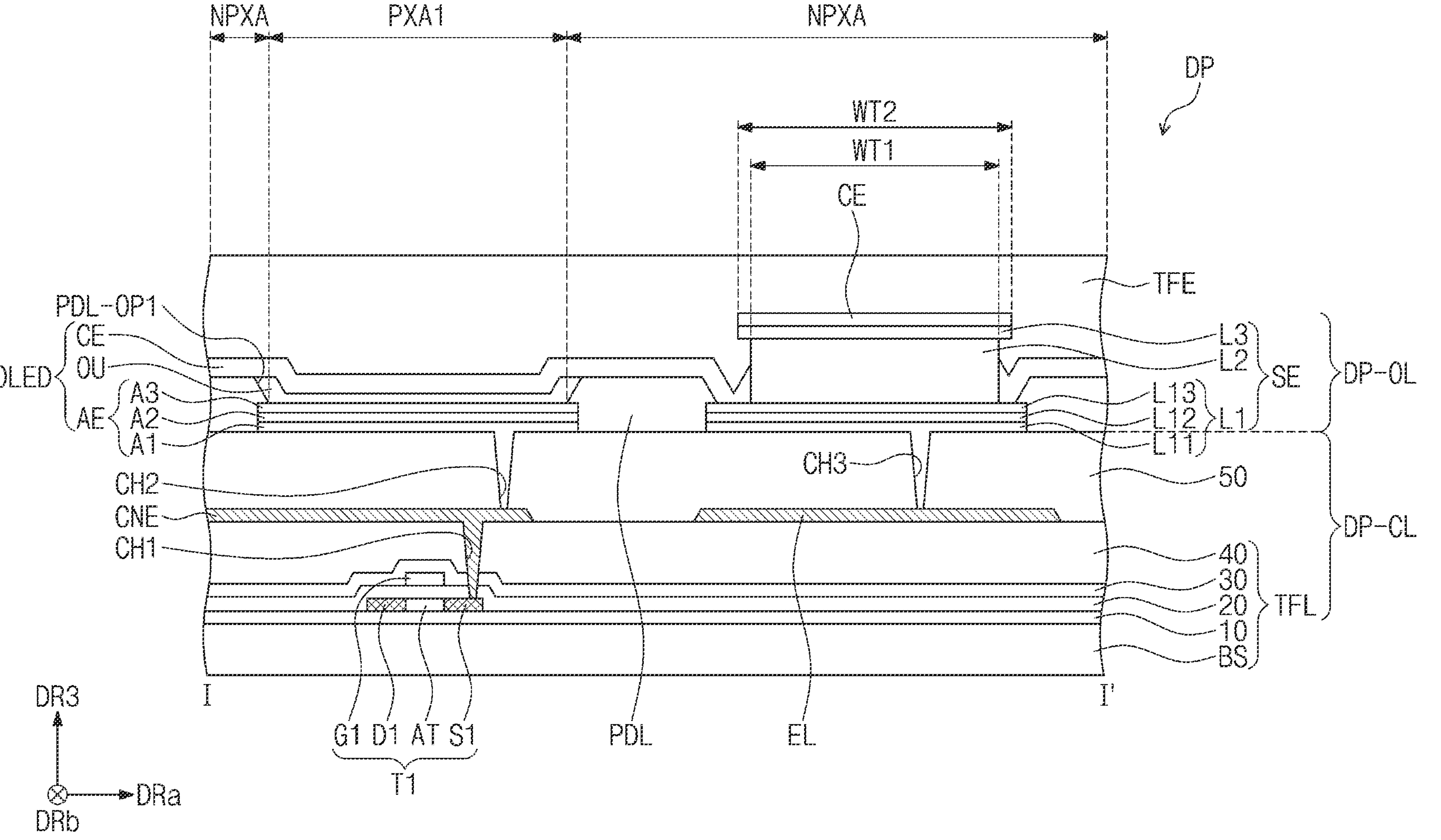
FIG. 7A is a cross-sectional view of a display panel cut along I-I' of FIG. 6 according to an embodiment of the present disclosure.

The first light-emitting area PXA1 may be defined by a first opening PDL-OPi defined in a pixel defining layer PDL (refer to FIG. 7A). The first light-emitting area PXA1 may be spaced apart from the second light-emitting area PXA2 by a first distance DS1 in each of the first direction DR1 and the second direction DR2. For example, the first distance DS1 may be in a range of 27 μm (micrometers) to 27.5 μm. The first light-emitting area PXA1 may be spaced apart from the third light-emitting area PXA3 by a second distance DS2 in a first intersection direction DRa.

The first intersection direction DRa may intersect the first direction DR1 and the second direction DR2. For example, the second distance DS2 may be in a range of 19 μm to 19.5 μm.

The first light-emitting area PXA1 may include a plurality of first light-emitting areas. The plurality of first light-emitting areas PXA1 may be disposed to be spaced apart from each other in each of the first direction DR1 and the second direction DR2 with the second light-emitting area PXA2 interposed therebetween.

The second light-emitting area PXA2 may be defined by a second opening PDL-OP2 defined in the pixel defining layer PDL (refer to FIG. 7A). The second light-emitting area PXA2 may be spaced apart from the first light-emitting area PXA1 by the first distance DS1 in each of the first direction DR1 and the second direction DR2. The second light-emitting area PXA2 may be spaced apart from the third light-emitting area PXA3 by a third distance DS3 in a second intersection direction DRb. The second intersection direction DRb may intersect the first intersection direction DRa. For example, the third distance DS3 may be in a range of 19 μm to 19.5 sm.

The second light-emitting area PXA2 may include a plurality of second light-emitting areas. The plurality of second light-emitting areas PXA2 may be disposed to be spaced apart from each other in each of the first direction DR1 and the second direction DR2 with the first light-emitting area PXA1 interposed therebetween.

The third light-emitting area PXA3 may be defined by a third opening PDL-OP3 defined in the pixel defining layer PDL (refer to FIG. 7A). The third light-emitting area PXA3 may be spaced apart from the first light-emitting area PXA1 in the first intersection direction DRa. The third light-emitting area PXA3 may be spaced apart from the second light-emitting area PXA2 in the second intersection direction DRb.

The third light-emitting area PXA3 may include a plurality of third light-emitting areas. The plurality of third light-emitting areas PXA3 may be arranged in each of the first direction DR1 and the second direction DR2.

In one example, an arrangement form of the first to third light-emitting areas PXA1, PXA2, and PXA3 illustrated in FIG. 6 is an example. The present disclosure is not limited thereto, and the arrangement form of the light-emitting areas may vary according to a design of the display device DD.

Each of the first to third light-emitting areas PXA1, PXA2, and PXA3 may have a polygonal shape in a plan view.

For example, a shape of the first light-emitting area PXA1 may be an octagon. The shape of the first light-emitting area PXA1 may be symmetric about an axis extending in the first intersection direction DRa. The first light-emitting area PXA1 may have a first width WD1 extending in the first intersection direction DRa. For example, the first width WD1 may be in a range of 15 μm to 15.5 sm.

For example, a shape of the second light-emitting area PXA2 may be an octagon. The shape of the second light-emitting area PXA2 may be symmetrical about an axis extending in the second intersection direction DRb. The second light-emitting area PXA2 may have a second width WD2 extending in the second intersection direction DRb. For example, the second width WD2 may be in a range of 15 μm to 15.5 μm.

For example, a shape of the third light-emitting area PXA3 may be an octagon. The third light-emitting area PXA3 may have a third width WD3 extending in the second direction DR2. For example, the third width WD3 may be in a range of 12.5 μm to 13.5 μm.

An area size of the second light-emitting area PXA2 may be larger than an area size of the first light-emitting area PXA1, and the area size of the first light-emitting area PXA1 may be larger than an area size of the third light-emitting area PXA3.

The shapes and the area sizes of the first to third light-emitting areas PXA1, PXA2, and PXA3 may be designed in various ways in consideration of light emission efficiency of colors emitted through the areas, and thus may not be limited to the embodiment illustrated in FIG. 4. For example, each of the first to third light-emitting areas PXA1, PXA2, and PXA3 may have a rectangular shape or a circular shape. Alternatively, some of the first to third light-emitting areas PXA1, PXA2, and PXA3 may have a rhombus shape and the other thereof may have an octagonal shape. However, the present disclosure is not limited thereto.

The non-light-emitting area NPXA may define boundaries between the light-emitting areas PXA1, PXA2, and PXA3, and may prevent color mixing between the light-emitting areas PXA1, PXA2, and PXA3.

The display panel DP may further include an auxiliary electrode SE disposed in the non-light-emitting area NPXA. The auxiliary electrode SE may extend in either the first intersection direction DRa or the second intersection direction DRb. In the plan view, the auxiliary electrode SE may not overlap the light-emitting areas PXA1, PXA2, and PXA3. Further, in the plan view, the auxiliary electrode SE may not overlap each of the first opening PDL-OP1, the second opening PDL-OP2, and the third opening PDL-OP3.

The auxiliary electrode SE illustrated in FIG. 6 is illustrated in a simplified manner for convenience of illustration. An arrangement, a shape, an area, etc. of the auxiliary electrode SE may vary depending on a design of the display panel DP.

FIG. 7A is a cross-sectional view of the display panel cut along I-I' of FIG. 6 according to an embodiment of the present disclosure.

Referring to FIG. 7A, the display panel DP may include the base substrate BS, the circuit layer DP-CL, the display element layer DP-OL and the encapsulation layer TFE.

The display panel DP may include insulating layers, a semiconductor pattern, a conductive pattern, a signal line, etc. In a manufacturing step of the display panel DP, an insulating layer, a semiconductor layer, and a conductive layer may be formed on the base substrate BS using a scheme such as coating and deposition. Thereafter, the insulating layer, the semiconductor layer, and the conductive layer may be selectively patterned using a photolithography scheme. In this process, the semiconductor pattern, the conductive pattern, the signal line, etc. included in the circuit layer DP-CL may be formed. The semiconductor patterns of the circuit layer DP-CL may be arranged in a predetermined rule across the pixels.

The base substrate BS may include a glass substrate, a metal substrate, a polymer substrate, or an organic/inorganic composite material substrate. The base substrate BS may have a single-layer or multi-layer structure. For example, the multi-layered base substrate BS may include synthetic resin layers and at least one inorganic layer disposed between the synthetic resin layers.

The synthetic resin layer may include at least one of acrylate-based resin, methacrylate-based resin, polyisoprene-based resin, vinyl-based resin, epoxy-based resin, urethane-based resin, cellulose-based resin, siloxane-based resin, polyamide-based resin, perylene-based resin, or polyimide-based resin. However, a material of the synthetic resin layer of the base substrate BS is not limited to the above example.

At least one inorganic layer may be disposed on a top face of the base substrate BS. The inorganic layer may constitute a barrier layer and/or a buffer layer. FIG. 5 shows an example in which the inorganic layer is embodied as a buffer layer 10. The buffer layer 10 may improve a bonding force between the base substrate BS and the semiconductor pattern of the circuit layer DP-CL. The buffer layer 10 may include at least one of aluminum oxide, titanium oxide, silicon oxide, silicon nitride, silicon oxynitride, zirconium oxide, or hafnium oxide. However, the present disclosure is not limited thereto.

The semiconductor pattern of the circuit layer DP-CL may be disposed on the buffer layer 10. The semiconductor pattern may include polysilicon. However, the present disclosure is not limited thereto, and the semiconductor pattern may include amorphous silicon or metal oxide.

The semiconductor pattern may have electrical properties varying depending on whether it is doped with a dopant. The semiconductor pattern may include a first area having high conductivity and a second area having low conductivity. The first area may be doped with an N-type dopant or a P-type dopant. A P-type transistor may include a doped area doped with a P-type dopant, and an N-type transistor may include a doped area doped with an N-type dopant. The second area may be a non-doped area or an area doped with the dopant at a lower concentration than that of the first area.

The conductivity of the first area may be greater than that of the second area, and the first area may actually act as an electrode or a signal line. The second area may substantially correspond to an active area (or a channel area) of a transistor. In other words, one portion of the semiconductor pattern may be the active area of the transistor and the other portion thereof may be a source or a drain of the transistor.

The circuit layer DP-CL may include a plurality of transistors constituting the pixel circuit PC and a plurality of insulating layers. FIG. 5 shows the first transistor T1 and first to fourth insulating layers 20, 30, 40, and 50 by way of example. Each of the source Si, an active area AT, and the drain D1 of the first transistor T1 may be embodied as the semiconductor pattern.

The first to fourth insulating layers 20, 30, 40, and 50 may be disposed on the buffer layer 10. Each of the first to fourth insulating layers 20, 30, 40, and 50 may include an inorganic layer or an organic layer, and may have a single-layer structure or a multi-layer structure.

The inorganic layer may include at least one of aluminum oxide, titanium oxide, silicon oxide, silicon nitride, silicon oxynitride, zirconium oxide, or hafnium oxide. However, the present disclosure is not limited thereto. The organic layer may include phenol-based polymers, acrylic polymers, imide-based polymers, arylether-based polymers, amide-based polymers, fluorine-based polymers, p-xylene-based polymers, vinyl alcohol-based polymers, or combinations thereof. However, the present disclosure is not limited thereto.

The first insulating layer 20 may cover the semiconductor pattern of the circuit layer DP-CL. The gate G1 of the first transistor T1 may be disposed on the first insulating layer 20. The gate G1 may be a portion of a conductive pattern. The gate G1 may overlap the active area AT. The gate G1 may function as a self-aligned mask in a process of doping the semiconductor pattern with a dopant. The second insulating layer 30 may be disposed on the first insulating layer 20 and may cover the gate G1. The third insulating layer 40 may be disposed on the second insulating layer 30.

In one example, a layer including the buffer layer 10, the first to third insulating layers 20, 30, and 40, and the transistor (for example, the first transistor T1 in FIG. 5) formed between the insulating layers may be defined as a transistor layer TFL.

A connection electrode CNE may be disposed between the first transistor T1 and the light-emitting element OLED so as to connect the first transistor T1 and the light-emitting element OLED to each other. The connection electrode CNE may be disposed on the third insulating layer 40 and may be connected to the source Si via a first contact hole CH1 formed through the first, second and third insulating layers 20, 30 and 40.

An auxiliary wiring EL may be disposed on the third insulating layer 40. In an embodiment, the auxiliary wiring EL may be disposed in the same layer as the connection electrode CNE. The auxiliary wiring EL may be electrically connected to a power line receiving the second voltage ELVSS (refer to FIG. 5) and provide the second voltage.

The fourth insulating layer 50 may be disposed on the third insulating layer 40. The fourth insulating layer 50 may cover the connection electrode CNE and auxiliary wiring EL. In an embodiment, the fourth insulating layer 50 may include an organic layer. The fourth insulating layer 50 including the organic layer may provide a flat top face. However, an embodiment is not necessarily limited thereto.

The display element layer DP-OL may be disposed on the circuit layer DP-CL. The display element layer DP-OL may include the plurality of light-emitting elements OLED, the pixel defining layer PDL, and the auxiliary electrode SE. The light-emitting element OLED may include a first electrode AE (or a pixel electrode), a light-emitting layer OU, a second electrode CE (or a common electrode).

The first electrode AE may be disposed in the first area on the base substrate BS. In an embodiment, the first electrode AE may be disposed on the fourth insulating layer 50 of the circuit layer DP-CL. The first electrode AE may be connected to the connection electrode CNE via a second contact hole CH2 formed through the fourth insulating layer 50. The first electrode AE may be connected to the first transistor T1 via the connection electrode CNE. The first electrode AE may include a first pixel electrode layer A1, a second pixel electrode layer A2, and a third pixel electrode layer A3.

The first pixel electrode layer A1 may be disposed on the fourth insulating layer 50. The first pixel electrode layer A1 may include indium tin oxide (ITO). For example, a thickness of the first pixel electrode layer A1 may be 50 angstroms.

The second pixel electrode layer A2 may be disposed on the first pixel electrode layer A1. The second pixel electrode layer A2 may include silver (Ag). A thickness of the second pixel electrode layer A2 may be greater than the thickness of the first pixel electrode layer A1. For example, the thickness of the second pixel electrode layer A2 may be 1000 angstroms.

The third pixel electrode layer A3 may be disposed on the second pixel electrode layer A2. The third pixel electrode layer A3 may include the same material as that of the first pixel electrode layer A1. The third pixel electrode layer A3 may include indium tin oxide ITO. A thickness of the third pixel electrode layer A3 may be smaller than the thickness of the second pixel electrode layer A2. The thickness of the third pixel electrode layer A3 may be the same as the thickness of the first pixel electrode layer A1. For example, the thickness of the third pixel electrode layer A3 may be 50 angstroms.

The pixel defining layer PDL may be disposed on the fourth insulating layer 50. The pixel defining layer PDL may have the first opening PDL-OP1 defined therein and exposing a portion of the first electrode AE. The pixel defining layer PDL may cover one portion of a top face of the first electrode AE. The portion of the first electrode AE exposed through the first opening PDL-OP1 of the pixel defining layer PDL may correspond to the first light-emitting area PXA1.

The pixel defining layer PDL may include an organic material. For example, the pixel defining layer PDL may include polyacrylate-based resin or polyimide-based resin. However, a material of the pixel defining layer PDL is not limited to the above example. In one example, the pixel defining layer PDL may be made of an inorganic material. For example, the pixel defining layer PDL may include silicon nitride ($SiN_x$), silicon oxide ($SiO_x$), silicon nitride ($SiO_xN_y$), or the like. However, the material of the pixel defining layer PDL is not limited to the above example.

The pixel defining layer PDL may include a light absorbing material or may have a predetermined color. For example, the pixel defining layer PDL may include a base resin and black pigments and/or black dyes mixed into the base resin.

The light-emitting layer OU may be disposed in the first opening PDL-OP1. The light-emitting layer OU may include a plurality of organic layers and a charge generating layer disposed between the first electrode AE and the second electrode CE facing each other. The plurality of organic layers may be sequentially formed along a third direction. Each of the plurality of organic layers may include functional layers including a hole transport material and an electron transport material, and a light-emitting material. In an embodiment, the light-emitting element OLED may be a light-emitting element of a tandem structure including a plurality of light-emitting layers.

The second electrode CE may face the first electrode AE and may be disposed on the light-emitting layer OU. The second electrode CE may be provided as a common layer overlapping the light-emitting area PXA and the non-light-emitting area NPXA. A common voltage may be provided to the second electrode CE. For example, the common voltage may be the second voltage ELVSS (refer to FIG. 5).

The second electrode CE may be a transflective electrode or a reflective electrode. The second electrode CE may include silver (Ag) or a compound or mixture (for example, AgMg, AgYb, or MgAg) including the sliver. However, this is an example, and the second electrode CE according to an embodiment of the present disclosure may include Mg, Cu, Al, Pt, Pd, Au, Ni, Nd, Ir, Cr, Li, Ca, LiF/Ca, LiF/Al, Mo, Ti, Yb, W, In, Zn, Sn, or a compound or mixture including the same.

However, the present disclosure is not limited thereto, and the second electrode CE may include a plurality of layers including a reflective or transflective film made of the above material, and a transparent conductive film made of ITO (indium tin oxide), IZO (indium zinc oxide), ZnO (zinc oxide), ITZO (indium tin zinc oxide), etc.

The second electrode CE may be formed to be thinly deposited so as to have light transmittance. For example, a thickness of the second electrode CE may be smaller than 100 angstroms. However, the thickness of the second electrode CE is not limited to the above example.

The auxiliary electrode SE may be disposed in the non-light-emitting area NPXA. The auxiliary electrode SE may be disposed on the fourth insulating layer 50 of the circuit layer DP-CL. The auxiliary electrode SE may be connected to the auxiliary wiring EL via a third contact hole CH3 formed through the fourth insulating layer 50. The second voltage ELVSS (refer to FIG. 5) may be applied to the auxiliary electrode SE via the auxiliary wiring EL.

The auxiliary electrode SE may include a first layer L1, a second layer L2, and a third layer L3. The first layer may be disposed in the same layer as a layer in which the first electrode AE is disposed. The auxiliary electrode SE may be formed as an island shape and spaced apart from the first electrode AE in the plan view.

The first layer L1 may be disposed on the fourth insulating layer 50. The first layer L1 may include a first auxiliary layer L11, a second auxiliary layer L12, and a third auxiliary layer L13.

The first auxiliary layer L11 may be disposed on the fourth insulating layer 50. The first auxiliary layer L11 may be disposed in the same layer as a layer in which the first pixel electrode layer A1 is disposed. The first auxiliary layer L11 may include the same material as that of the first pixel electrode layer A1. The first auxiliary layer L11 may include indium tin oxide. For example, a thickness of the first auxiliary layer L11 may be 50 angstroms.

The second auxiliary layer L12 may be disposed on the first auxiliary layer L11. The second auxiliary layer L12 may be disposed in the same layer as a layer in which the second pixel electrode layer A2 is disposed. The second auxiliary layer L12 may include the same material as that of the second pixel electrode layer A2.

The second auxiliary layer L12 may include silver (Ag). For example, a thickness of the second auxiliary layer L12 may be 1000 angstroms.

The third auxiliary layer L13 may be disposed on the second auxiliary layer L12. The third auxiliary layer L13 may be disposed in the same layer as a layer in which the third pixel electrode layer A3 is disposed. The third auxiliary layer L13 may include the same material as that of the third pixel electrode layer A3. The third auxiliary layer L13 may include indium tin oxide. A thickness of the third auxiliary layer L13 may be smaller than the thickness of the second auxiliary layer L12. The thickness of the third auxiliary layer L13 may be the same as the thickness of the first auxiliary layer L11. For example, the thickness of the third auxiliary layer L13 may be 50 angstroms.

According to the present disclosure, the first layer Li may include the same material as that of the first electrode AE. For this reason, the first layer L1 and the first electrode AE may be formed through the same process. That is, the process of forming the auxiliary electrode SE may be performed simultaneously with the process of forming the first electrode AE. This may shorten a process time. A tact time (a manufacturing time consumed per a product) required to manufacture the display device DD (refer to FIG. 1) may be reduced.

The second layer L2 may be disposed on the first layer Li. For example, the second layer L2 may be disposed on the third auxiliary layer L13. A side face of the second layer L2 may be in direct contact with the second electrode CE. Thus, the auxiliary electrode SE may be electrically connected to the second electrode CE. The second layer L2 may include silver (Ag) or silver alloy (Ag alloy). The silver alloy may include AgIn.

When the display device DD (refer to FIG. 1) have a large area, a resistance of the second electrode CE may increase, thus a voltage drop (IR drop), which may prevent uniform image quality throughout the display device, may occur. However, according to the present disclosure, because the second electrode CE is connected to the auxiliary wiring EL via the second layer L2, which include the same material as one of materials included in the second electrode CE, for example, silver, the contact resistance of the second electrode CE to the auxiliary electrode SE may be reduced.

The second electrode CE may easily contact the side surface of the second layer L2 with no substantial contact resistance because the second electrode CE and the second layer L2 include the same material. The second electrode CE may be electrically connected to the auxiliary electrode SE to the side surface of the second layer L2. The second electrode CE electrically connected to the auxiliary electrode SE may prevent the voltage drop due to the low contact resistance therebetween.

Therefore, the display device DD (refer to FIG. 1) with uniform image luminance may be realized.

When the auxiliary electrode EL includes copper (Cu) or aluminum (A1) instead of silver, the auxiliary electrode may be oxidized in a process of electrically connecting the auxiliary electrode and the second electrode CE to each other. For example, when the auxiliary electrode including copper is oxidized, copper oxide ($CuO_x$) may be formed on the side surface of the auxiliary electrode. The copper oxide may have insulating property. Due to the insulating property, the auxiliary electrode SE may not be electrically connected to the second electrode CE.

Alternatively, when the auxiliary electrode including aluminum is oxidized, aluminum oxide ($Al_2O_3$) may be formed on the side surface of the auxiliary electrode.

The aluminum oxide may have insulating property. Due to the insulating property, the auxiliary electrode SE may not be electrically connected to the second electrode CE. However, according to the present disclosure, the second layer L2 may include silver (Ag). The silver is less oxidizable than copper or aluminum. Thus, silver oxide may not easily formed on a side surface of the sliver. That is, the auxiliary electrode SE including the silver may be connected to the second electrode CE with no substantial contact resistance. Thus, the resistance of the second electrode CE may be reduced. Thus, the second electrode CE electrically connected to the auxiliary electrode SE may prevent the voltage drop problem. Therefore, the display device DD (refer to FIG. 1) with improved reliability may be realized.

The thickness of the second layer L2 may be greater than the thickness of the first layer Li. The thickness of the second layer L2 may be in a range of 2500 to 3500 angstroms. For example, the thickness of the second layer L2 may be 3000 angstroms. According to the present disclosure, the second electrode CE may easily contact the side face of the second layer L2 due to the thickness of the second layer L2. The second electrode CE may be electrically connected to the auxiliary electrode SE. The resistance of the second electrode CE may be reduced. The second electrode CE electrically connected to the auxiliary electrode SE may prevent the voltage drop problem. Therefore, the display device DD (refer to FIG. 1) with improved reliability may be realized.

The third layer L3 may be disposed on the second layer L2. The third layer L3 may include molybdenum (Mo) or molybdenum alloy (Mo alloy). The molybdenum alloy may include MoNb.

When the third layer L3 includes titanium (Ti) rather than molybdenum, an end portion of the third layer protrudes by an amount exceeding a proper amount and thus is bent due to a low modulus of titanium when the third layer of the auxiliary electrode is formed. This is referred to as warpage. The modulus of titanium may be 116 GPa (Gigapascal). When the encapsulation layer TFE is subsequently formed, a problem that the encapsulation layer TFE is not properly stacked thereon may occur due to the warpage. Further, the end portion protruding by the amount exceeding the proper amount may be removed away from the third layer during the process, and thus may become a particle source such that a large number of dark spots may occur.

However, according to the present disclosure, the third layer L3 may include molybdenum. A modulus of molybdenum may be higher than that of titanium. The modulus of molybdenum may be 327 GPa. The third layer L3 including molybdenum may have higher elasticity than that of the third layer including titanium. The warpage of the third layer L3 may be prevented. Therefore, the display device DD (refer to FIG. 1) with improved reliability may be realized.

Further, according to the present disclosure, a resistivity of molybdenum may be lower than that of titanium. For example, the resistivity of molybdenum may be 13 μΩ-cm, while the resistivity of titanium may be 75 μΩ-cm. That is, the auxiliary electrode SE including molybdenum may be electrically connected to the second electrode CE to reduce the resistance of the second electrode CE. The second electrode CE electrically connected to the auxiliary electrode SE may prevent the voltage drop problem. Therefore, the display device DD (refer to FIG. 1) with improved reliability may be realized.

Further, contrary to the present disclosure, titanium may be oxidized to produce titanium oxide ($TiO_2$). Titanium oxide may have insulating property. However, according to the present disclosure, when molybdenum is oxidized, molybdenum oxide ($MoO_2$) may be produced. Molybdenum oxide may have conductivity. That is, even when the third layer L3 is oxidized, the third layer is electrically connected to the second electrode CE, thereby reducing the resistance of the second electrode CE. The second electrode CE electrically connected to the auxiliary electrode SE may prevent the voltage drop problem. Therefore, the display device DD (refer to FIG. 1) with improved reliability may be realized.

The thickness of the third layer L3 may be smaller than the thickness of the second layer L2. The thickness of the third layer L3 may be 1000 angstroms.

A width WT1 in the first intersection direction DRa of the second layer L2 may be smaller than a width WT2 in the first intersection direction DRa of the third layer L3. The third layer L3 may have a tip protruding outwardly beyond the second layer L2.

After the auxiliary electrode SE is formed, the second electrode CE may be formed. Accordingly, the second electrode CE may be disposed on the third layer L3.

The encapsulation layer TFE may be disposed on the display element layer DP-OL so as to seal the display element layer DP-OL. The encapsulation layer TFE may include a plurality of inorganic films and at least one organic film.

Each of the plurality of inorganic layers may protect the light-emitting elements OLED from moisture and/or oxygen. Each of the plurality of inorganic layers may include at least one of aluminum oxide, titanium oxide, silicon oxide, silicon nitride, silicon oxynitride, zirconium oxide, and hafnium oxide. However, a material thereof is not limited thereto.

The at least one organic film may protect the light-emitting element OLED from a foreign material, such as dust particles. The at least one organic film may include an acrylic-based resin. However, the present disclosure is not limited to this example.

Figure 7B:
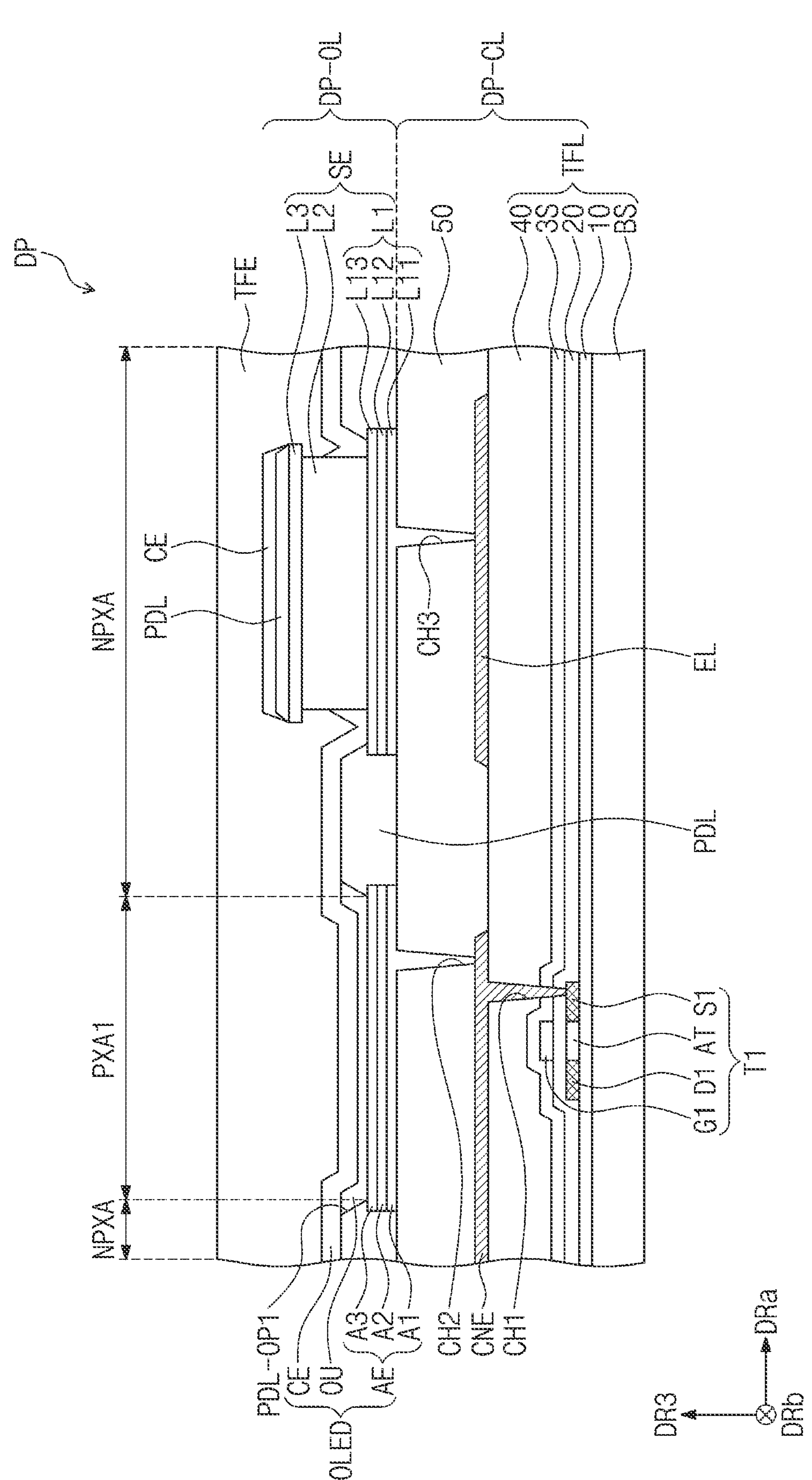
FIG. 7B is a cross-sectional view of a display panel according to an embodiment of the present disclosure.

FIG. 7B is a cross-sectional view of a display panel according to an embodiment of the present disclosure. In the description of FIG. 7B, the same reference numerals are allocated to the components as described using FIG. 7A, and the description thereof is omitted.

Referring to FIG. 7B, the pixel defining layer PDL may be formed after the auxiliary electrode SE is formed. Accordingly, the pixel defining layer PDL may be disposed on the third layer L3. After the pixel defining layer PDL is formed, the second electrode CE may be formed. Accordingly, the third layer L3, the pixel defining layer PDL, and the second electrode CE may be sequentially stacked in the third direction DR3 on the second layer L2.

Figure 8:
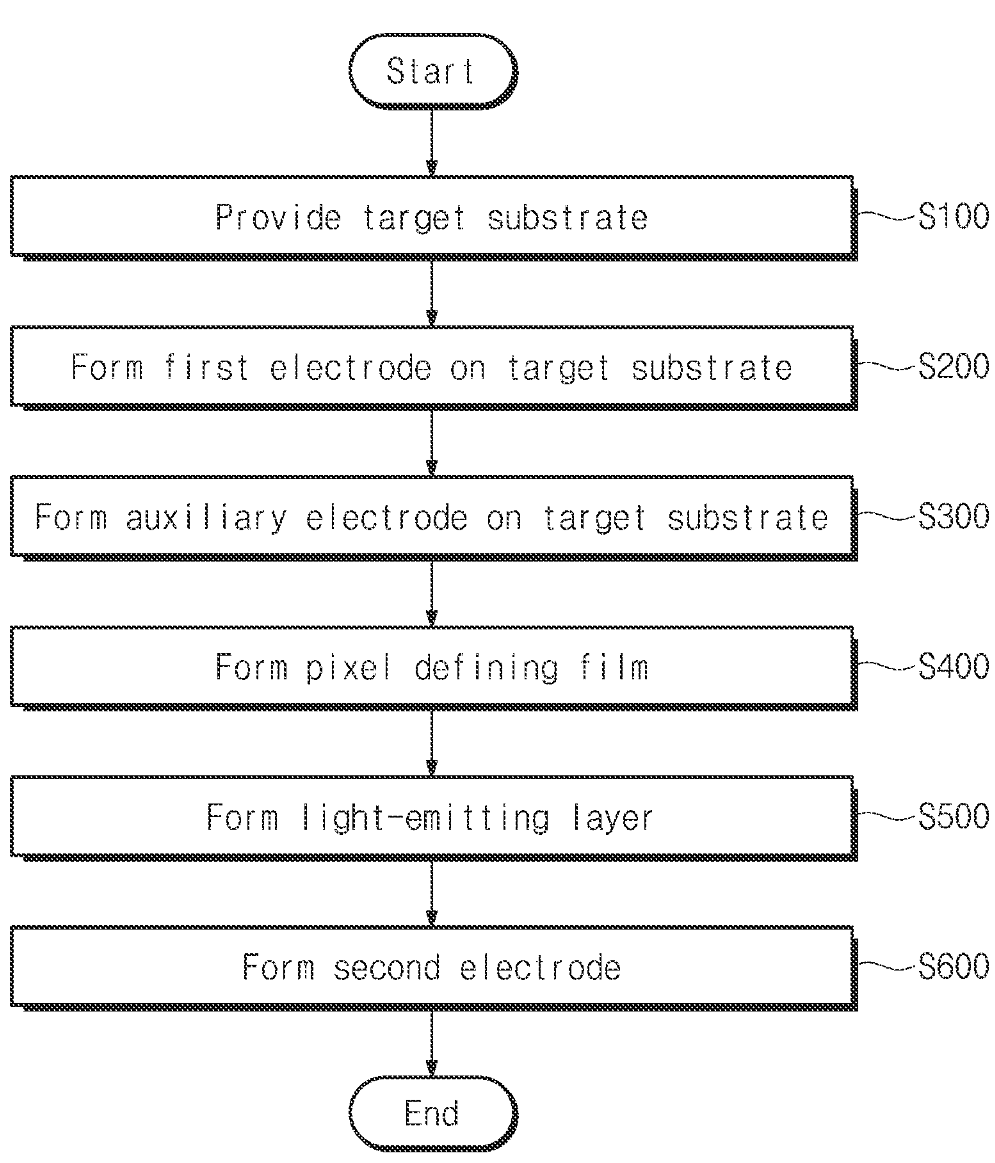
FIG. 8 is a flowchart illustrating a method for manufacturing a display device according to an embodiment of the present disclosure.
Figure 9A:
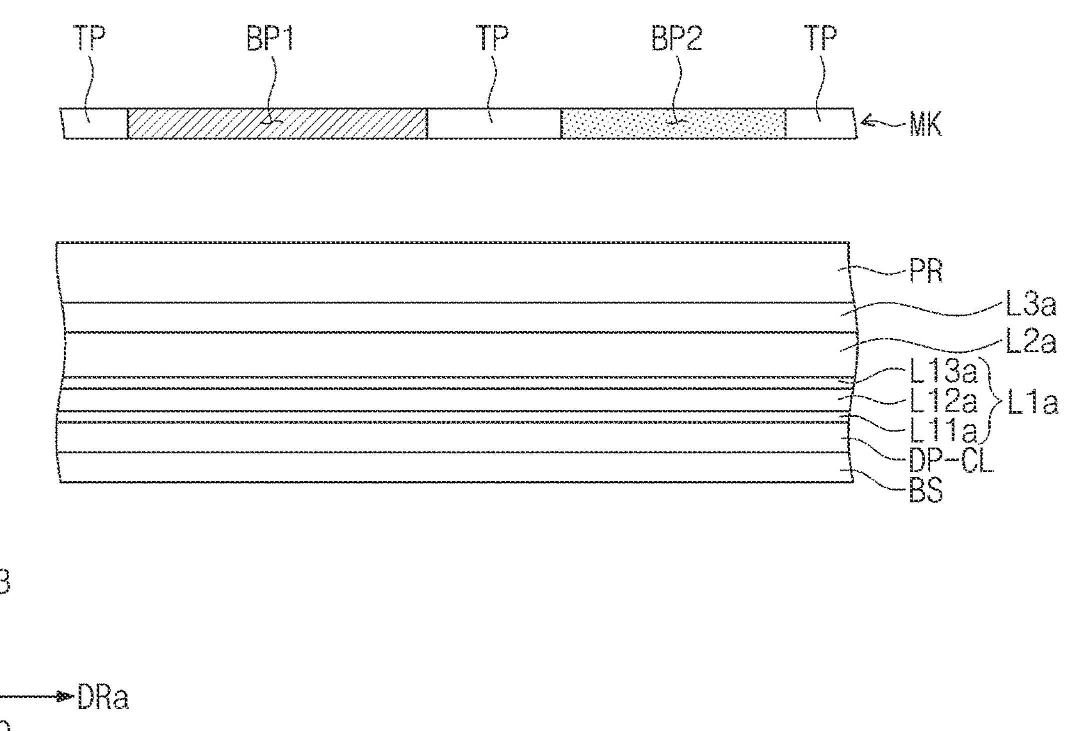
FIG. 9A is a cross-sectional view showing some of steps of forming a first electrode and an auxiliary electrode according to an embodiment of the present disclosure.

FIG. 8 is a flowchart illustrating a method for manufacturing a display device according to an embodiment of the present disclosure. FIG. 9A is a cross-sectional view showing some of steps of forming a first electrode and an auxiliary electrode according to an embodiment of the present disclosure. In the description of FIG. 9A, the same reference numerals are allocated to the components described using FIG. 7A, and the description thereof is omitted.

Referring to FIG. 8 and FIG. 9A, a target substrate including the base substrate BS and the circuit layer DP-CL may be provided in S100. Although not shown separately, in the manufacturing process, the base substrate BS may be disposed on a work substrate (not shown). After the display panel has been manufactured, the work substrate may be removed from the base substrate BS.

A plurality of metal layers may be formed on the circuit layer DP-CL. The plurality of metal layers may include a pre-first layer Lia, a pre-second layer L2a, and a pre-third layer L3a.

The pre-first layer Lia may be formed on the circuit layer DP-CL. The pre-first layer Lia may include a pre-first auxiliary layer L11a, a pre-second auxiliary layer L12a, and a pre-third auxiliary layer L13a.

The pre-first auxiliary layer L11a may be formed on the circuit layer DP-CL. The pre-first auxiliary layer L11a may include indium tin oxide.

The pre-second auxiliary layer L12a may be formed on the pre-first auxiliary layer L11a. The pre-second auxiliary layer L12a may include silver (Ag).

The pre-third auxiliary layer L13a may be formed on top of the pre-second auxiliary layer L12a. The pre-third auxiliary layer L13a may include indium tin oxide.

The pre-second layer L2a may be formed over the pre-third auxiliary layer L13a. The pre-second layer L2a may include silver (Ag) or silver alloy (Ag alloy).

The pre-second layer L2a may be thicker than the pre-second auxiliary layer L12a. The pre-third layer L3a may be formed on the pre-second layer L2a. The pre-third layer L3a may include molybdenum (Mo) or molybdenum alloy (Mo alloy). The pre-third layer L3a may be thinner than the pre-second layer L2a.

A photoresist layer PR may be formed on the pre-third layer L3a. The photoresist layer PR may include an organic material. After forming the photoresist layer PR, a mask MK is placed on the photoresist layer PR. The mask MK may include a plurality of light-transmissive areas TP and a plurality of light-blocking areas BP1 and BP2.

The photoresist layer PR may be a positive photoresist layer or a negative photoresist layer. Hereinafter, a case where the photoresist layer PR is a positive photoresist layer will be described by way of example.

The plurality of light-blocking areas BP1 and BP2 may include the first light-blocking area BP1 and the second light-blocking area BP2.

The first light-blocking area BP1 may have a halftone pattern. The first light-blocking area BP1 may overlap an area where the first electrode AE (refer to FIG. 7A) will be formed.

The second light-blocking area BP2 may overlap an area where auxiliary electrode SE (refer to FIG. 7A) will be formed.

The plurality of light-transmissive areas TP may overlap remaining areas other than the first electrode AE (refer to FIG. 7A) and the auxiliary electrode SE (refer to FIG. 7A)

in the plan view. After placing the mask MK on the photoresist layer PR, light may be irradiated thereto.

Figure 9B:
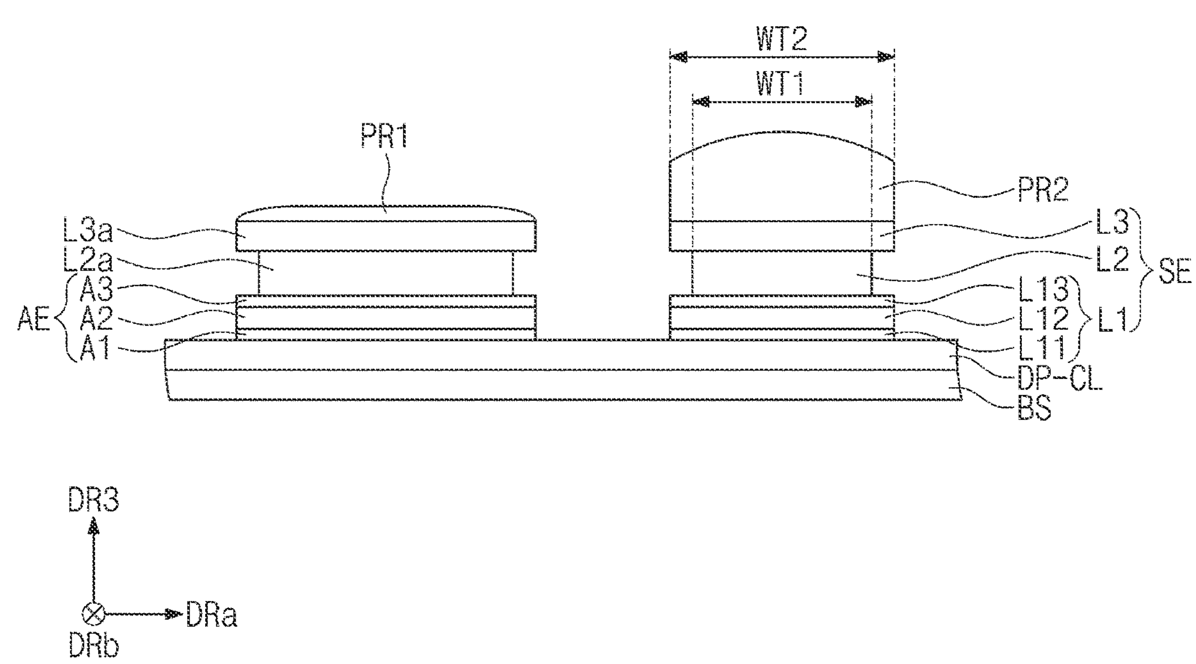
FIG. 9B is a cross-sectional view showing some of steps of forming a first electrode and an auxiliary electrode according to an embodiment of the present disclosure.

FIG. 9B is a cross-sectional view showing some of steps of forming a first electrode and an auxiliary electrode according to an embodiment of the present disclosure. In the description of FIG. 9B, the same reference numerals are allocated to the components described using FIG. 7A, and the description thereof is omitted.

Referring to FIGS. 8 and 9B, the photoresist layer PR may be patterned by the light irradiated to the photoresist layer PR such that a first photoresist layer PRI and a second photoresist layer PR2 may be formed. For example, the patterning may include an exposure process and a developing process.

The first photoresist layer PR1 may overlap an area where the first electrode AE (refer to FIG. 7A) will be formed. The second photoresist layer PR2 may overlap an area where the auxiliary electrode SE (refer to FIG. 7A) will be formed.

Due to the first light-blocking area BP1 with the halftone pattern, a thickness of the first photoresist layer PRI may be smaller than a thickness of the second photoresist layer PR2.

First etchant may be applied to the pre-first layer Lia, the pre-second layer L2a, and the pre-third layer L3a. The first etchant may include a mixture of phosphoric acid, nitric acid and acetic acid ($H_3PO_4$+$HNO_3$+$CH_3COOH$). The first etchant may simultaneously etch indium tin oxide (ITO), silver (Ag), and molybdenum (Mo). That is, the first etchant may simultaneously etch the pre-first layer Lia, the pre-second layer L2a, and the pre-third layer L3a.

The first electrode AE including the first pixel electrode layer A1, the second pixel electrode layer A2, and the third pixel electrode layer A3 may be formed in an area where the first photoresist layer PR1 is disposed. The pre-second layer L2a and the pre-third layer L3a may be disposed on the first electrode AE.

The auxiliary electrode SE including the first layer L1, the second layer L2, and the third layer L3 may be formed in an area where the second photoresist layer PR2 is disposed. The first layer L1, the second layer L2, and the third layer L3 may be simultaneously formed using the first etchant.

According to the present disclosure, the first electrode AE and the auxiliary electrode SE may be simultaneously formed using the first etchant capable of simultaneously etching the pre-first layer Lia, the pre-second layer L2a, and the pre-third layer L3a. This may shorten the process time. The tact time required to manufacture the display device DD (refer to FIG. 1) may be reduced. Therefore, the method for manufacturing the display device DD (refer to FIG. 1) with improved reliability may be realized.

Since etch rates of the pre-second layer L2a and the pre-third layer L3a to the first etchant are different from each other, the protrusion of the third layer L3 or an undercut of the second layer L2 may occur. Thus, the third layer L3 may have the tip protruding outwardly beyond the second layer L2. That is, the width WT1 of the second layer L2 may be smaller than the width WT2 of the third layer L3. The third layer L3 may have the tip protruding outwardly beyond the second layer L2.

Figure 9C:
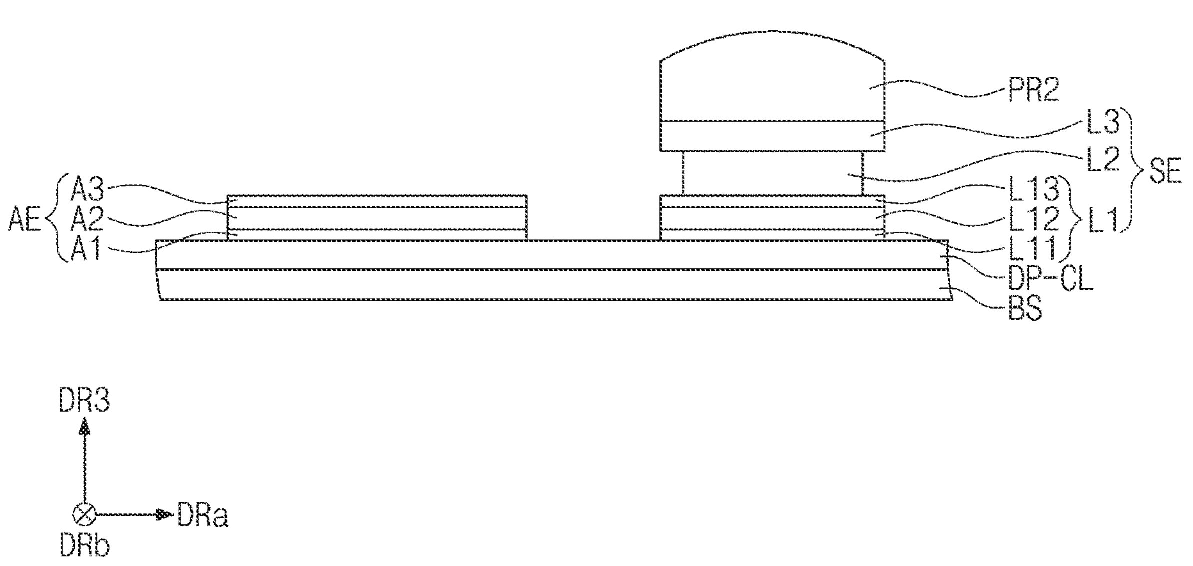
FIG. 9C is a cross-sectional view showing some of steps of forming a first electrode and an auxiliary electrode according to an embodiment of the present disclosure.

FIG. 9C is a cross-sectional view showing some of steps of forming a first electrode and an auxiliary electrode according to an embodiment of the present disclosure. In the description of FIG. 9C, the same reference numerals are allocated to the components described using FIG. 7A, and the description thereof is omitted.

Referring to FIG. 8 and FIG. 9C, the first photoresist layer PR1 may be removed. Second etchant may be applied to the pre-second layer L2a and the pre-third layer L3a. The second etchant may be different from the first etchant of FIG. 9B. The second etchant may be etchant dedicated to the silver (Ag). That is, the second etchant may selectively etch the silver (Ag). The second etchant may etch the pre-second layer L2a and the pre-third layer L3a disposed on the first electrode AE.

According to the present disclosure, a width of the protruding tip of the third layer L3 may be controlled using the second etchant. The second etchant may selectively etch the second layer L2. That is, formation of the tip may be easy.

Figure 9D:
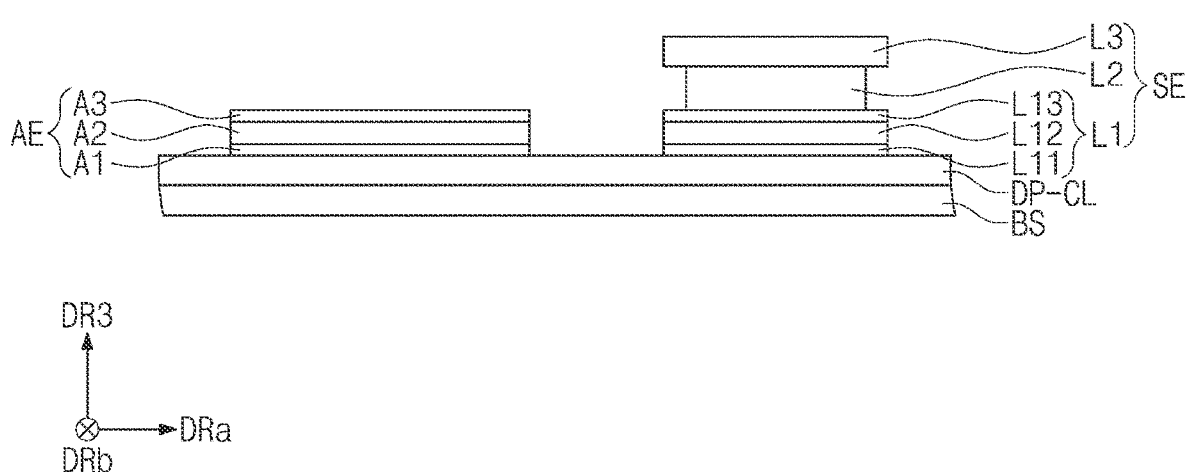
FIG. 9D is a cross-sectional view showing some of steps of forming a first electrode and an auxiliary electrode according to an embodiment of the present disclosure.

FIG. 9D is a cross-sectional view showing some of steps of forming a first electrode and an auxiliary electrode according to an embodiment of the present disclosure. In the description of FIG. 9D, the same reference numerals are allocated to the components described using FIG. 7A, and the description thereof is omitted.

Referring to FIG. 8 and FIG. 9D, the second photoresist layer PR2 may be removed. The first electrode AE may be formed on the circuit layer DP-CL in S200. The auxiliary electrode SE may be formed on the circuit layer DP-CL in S300.

According to the present disclosure, step S200 of forming the first electrode AE according to an embodiment of the present disclosure may proceed simultaneously with step S300 of forming the auxiliary electrode SE. A single mask MK may be used to form the first electrode AE and the auxiliary electrode SE. That is, the first electrode AE and the auxiliary electrode SE may be formed using the same process. This may shorten the process time. Therefore, the method for manufacturing the display device DD (refer to FIG. 1) with improved reliability may be realized.

Figure 9E:
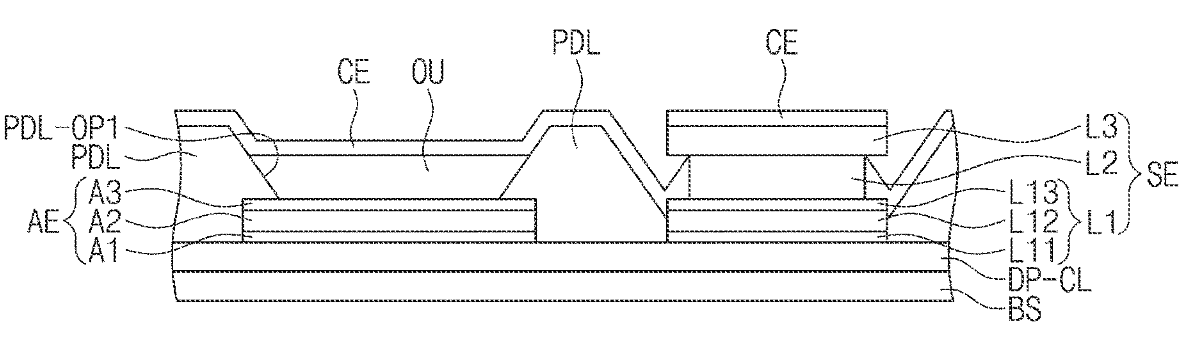
FIG. 9E is a cross-sectional view showing some of steps of manufacturing a display device according to an embodiment of the present disclosure.
Figure 9E:
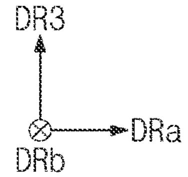

FIG. 9E is a cross-sectional view showing some of steps of manufacturing a display device according to an embodiment of the present disclosure. In the description of FIG. 9E, the same reference numerals are allocated to the components described using FIG. 7A, and the description thereof is omitted.

Referring to FIG. 8 and FIG. 9E, after the first electrode AE and auxiliary electrode SE have been formed, the pixel defining layer PDL may be formed in S400.

The first opening PDL-OP1 may be formed in the pixel defining layer PDL.

The light-emitting layer OU may be formed in the first opening PDL-OP1 in S500. However, this is an example, and the light-emitting layer OU according to an embodiment of the present disclosure may be formed on the first opening PDL-OP1 and the pixel defining layer PDL.

The second electrode CE may be formed on the light-emitting layer OU, the pixel defining layer PDL, and the auxiliary electrode SE in S600. The second electrode CE may be in contact with the side surface of the second layer L2.

According to the present disclosure, the second layer L2 may include the same material as one of the materials included in the second electrode CE. For example, the material may be silver (Ag). The second electrode CE may contact the side face of the second layer L2 including the same material as that of the second electrode CE with row contact resistance. The second electrode CE may be electrically connected to the auxiliary electrode SE. The resistance of the second electrode CE may be reduced. The second electrode CE electrically connected to the auxiliary electrode SE may prevent the voltage drop problem. Therefore, the display device DD (refer to FIG. 1) having improved reliability, and the method for manufacturing the display device DD (refer to FIG. 1) having improved reliability may be realized.

In accordance with the present disclosure, the second layer of the auxiliary electrode may include the same material as one of the materials included in the second electrode. For example, the material may be silver. The second electrode may contact the side face of the second layer including the same material as that of the second electrode with row contact resistance. The second electrode may be electrically connected to the auxiliary electrode. The resistance of the second electrode may be reduced. The second electrode electrically connected to the auxiliary electrode with the row contact resistance may prevent the voltage drop problem. Accordingly, the display device having uniform image luminance may be realized.

Further, in accordance with the present disclosure, the first electrode and the auxiliary electrode may be simultaneously formed using the first etchant capable of simultaneously etching the pre-first layer, the pre-second layer, and the pre-third layer. This may shorten the process time. The time required to manufacture the display device may be reduced. Accordingly, the method for manufacturing the display device with improved reliability may be realized.

Although the present disclosure has been described above with reference to a preferred embodiment of the present disclosure, it will be understood that those skilled in the art or those having ordinary knowledge in the technical field may modify and change the present disclosure in various ways without departing from the spirit and technical area of the present disclosure set forth in Claims as described below. Accordingly, the technical scope of the present disclosure is not limited to the contents as described in the detailed description of the specification, but should be defined by the claims.

What is claimed is:

1. A display device comprising:

a base substrate;

a circuit layer disposed on the base substrate;

a first electrode disposed on the circuit layer;

an auxiliary electrode disposed on the circuit layer and spaced apart from the first electrode;

a pixel defining layer disposed on the circuit layer and the first electrode, and having an opening which exposes a portion of the first electrode;

a light-emitting layer disposed in the opening; and a second electrode disposed on the light-emitting layer, wherein the auxiliary electrode includes:

a first layer including the same material as a material of the first electrode;

a second layer disposed on the first layer and including silver (Ag) or silver alloy (Ag alloy); and a third layer disposed on the second layer and including molybdenum (Mo) or molybdenum alloy (Mo alloy), and wherein the second electrode is in contact with a side surface of the second layer of the auxiliary electrode, and an upper surface of the auxiliary electrode including the first to the third layers is disposed higher than an upper surface of the first electrode from the base substrate.

2. The display device of claim 1, wherein the first electrode includes a layer made of indium tin oxide (ITO), a layer made of silver (Ag), and a layer made of indium tin oxide (ITO) stacked sequentially.

3. The display device of claim 1, wherein the first layer includes a layer made of indium tin oxide (ITO), a layer made of silver (Ag), and a layer made of indium tin oxide (ITO) stacked sequentially.

4. The display device of claim 1, wherein the second electrode is in contact with a top surface of the first layer.

5. The display device of claim 1, wherein the auxiliary electrode does not overlap the opening in a plan view.

6. The display device of claim 1, wherein the pixel defining layer is further disposed on the third layer.

7. The display device of claim 1, wherein a thickness of the second layer is greater than a thickness of the first layer.

8. The display device of claim 1, wherein the first electrode and the auxiliary electrode are disposed on the same layer.

9. The display device of claim 1, wherein the silver alloy includes AgIn alloy.

10. The display device of claim 1, wherein the molybdenum alloy includes MoNb alloy.

11. An electronic device comprising:

a base substrate;

a circuit layer disposed on the base substrate;

a first electrode disposed on the circuit layer;

an auxiliary electrode disposed on the circuit layer and spaced apart from the first electrode;

a pixel defining layer disposed on the circuit layer and the first electrode, and having an opening which exposes a portion of the first electrode;

a light-emitting layer disposed in the opening; and a second electrode disposed on the light-emitting layer, wherein the auxiliary electrode includes:

a first layer including the same material as a material of the first electrode;

a second layer disposed on the first layer and including silver (Ag) or silver alloy (Ag alloy); and a third layer disposed on the second layer and including molybdenum (Mo) or molybdenum alloy (Mo alloy), wherein the second electrode is in contact with a side surface of the second layer, and wherein a width of the second layer is smaller than a width of the third layer in a first direction.

12. The display device of claim 1, wherein the second electrode and the auxiliary electrode are electrically connected to each other.

13. The display device of claim 1, wherein the second electrode includes the same material as one of materials included in the second layer.

14. The display device of claim 13, wherein the second electrode includes AgMg alloy.

* * * * *